United States Patent [19]

Fudatsuji et al.

[11] Patent Number: 4,600,326

[45] Date of Patent: Jul. 15, 1986

[54] CASING STRUCTURE FOR ELECTRICAL AND MECHANICAL UNITS

[75] Inventors: Toshiharu Fudatsuji, Yokohama; Kazuhiro Gooda, Kawasaki; Takao Imazeki, Yokohama, all of Japan

[73] Assignee: Fujitsu Limited, Kawasaki, Japan

[21] Appl. No.: 670,294

[22] Filed: Nov. 13, 1984

[30] Foreign Application Priority Data

Nov. 14, 1983 [JP] Japan ............................ 58-213675
Nov. 14, 1983 [JP] Japan ......................... 58-175620[U]
Nov. 26, 1983 [JP] Japan ............................ 58-222397

[51] Int. Cl.$^4$ ............................................ B41J 29/02
[52] U.S. Cl. ................................ 400/691; 400/690.1; 181/201; 361/383
[58] Field of Search .................. 101/93.14; 400/689, 400/690, 690.1, 690.2, 690.3, 690.4, 691, 693, 694; 181/200, 201, 202; 292/251.5; 361/214, 380, 383

[56] References Cited

U.S. PATENT DOCUMENTS

| | | | |
|---|---|---|---|
| 2,701,618 | 2/1955 | Montgomery | 181/201 |
| 3,308,919 | 3/1967 | Cunningham | 400/690 |
| 3,407,869 | 10/1968 | Staunton | 361/383 X |
| 3,703,997 | 11/1972 | Epina et al. | 181/201 X |
| 3,962,608 | 6/1976 | Forster | 317/100 |
| 4,044,668 | 8/1977 | Barrus | 101/93.04 |
| 4,215,762 | 8/1980 | Cunningham et al. | 400/690.1 X |
| 4,252,453 | 2/1981 | Estabrooks | 400/690.1 |
| 4,452,475 | 6/1984 | Bloch et al. | 292/251.5 X |
| 4,482,064 | 11/1984 | Berke et al. | 400/691 X |

FOREIGN PATENT DOCUMENTS

| | | |
|---|---|---|
| 0020169 | 12/1980 | European Pat. Off. . |
| 2441045 | 3/1975 | Fed. Rep. of Germany ...... 181/200 |
| 1242626 | 8/1960 | France . |
| 0161686 | 12/1980 | Japan ............................... 400/690.1 |

OTHER PUBLICATIONS

EPC Search Report, dated 8/25/80.
IBM Tech. Discl. Bull., vol. 25, No. 7B, Dec. 1982, "Push-Pull Cooling Sys. with Single Blower," pp. 3904–3905.
IBM Tech. Discl. Bull., vol. 25, No. 7B, Dec. 1982, "Induced Cooling in a Unit Cooling Scheme," pp. 3906–3908.
IBM Technical Disclosure Bulletin, "Ventilation System for Data Processing Systems", by Hammer et al., vol. 17, No. 9, 2-'75, pp. 2529–2530.

Primary Examiner—Edgar S. Burr
Assistant Examiner—John A. Weresh
Attorney, Agent, or Firm—Staas & Halsey

[57] ABSTRACT

A casing structure which includes a first casing unit having a first compartment and a second compartment, and a second casing unit having a third compartment. The second casing unit is pivotably connected to the first casing unit so as to open or close with respect thereto. The three compartments have respective inlets and outlets which are connected in series through connecting passages including these outlets and inlets to define an air flow passage. A heat source and sound source, i.e., an electrical and mechanical unit, is arranged in the intermediate second compartment and an air cooling fan is provided in the air flow passage in the vicinity of the heat unit.

5 Claims, 66 Drawing Figures

Fig. 16
Fig. 17
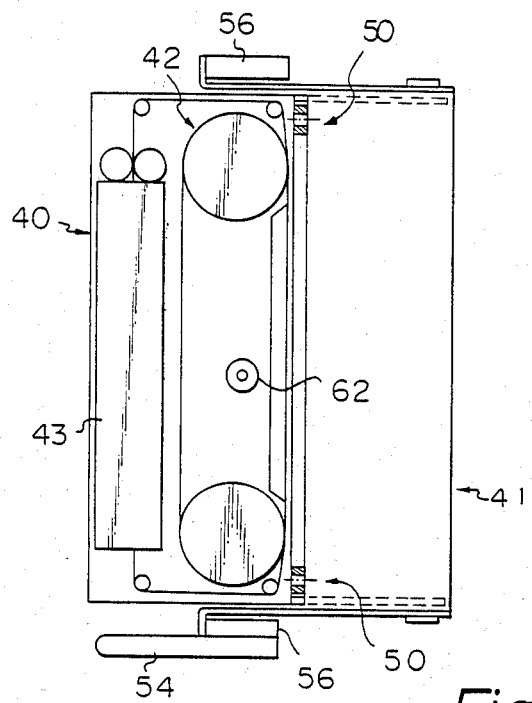
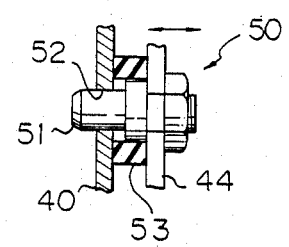
Fig. 18
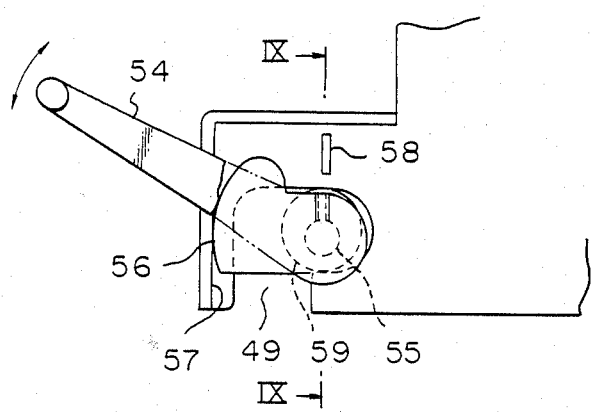

Fig. 38
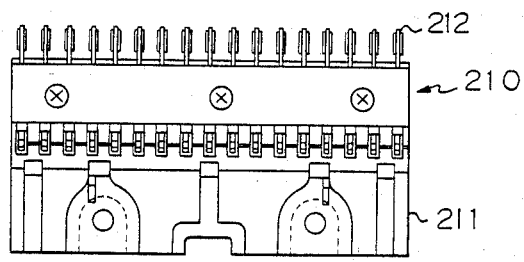
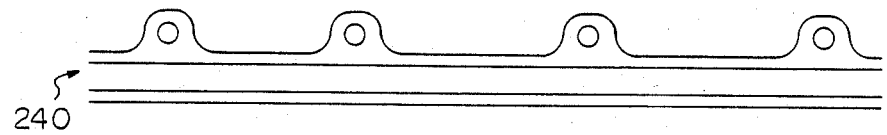
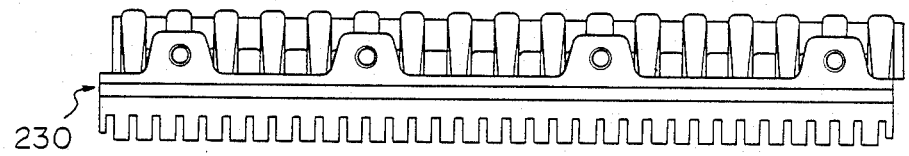
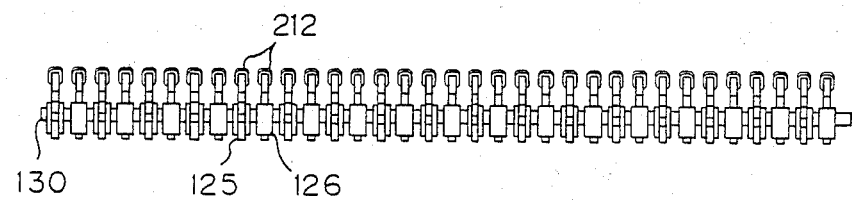
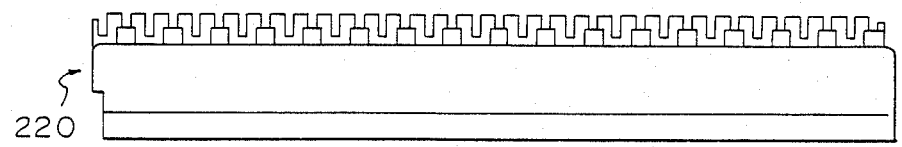

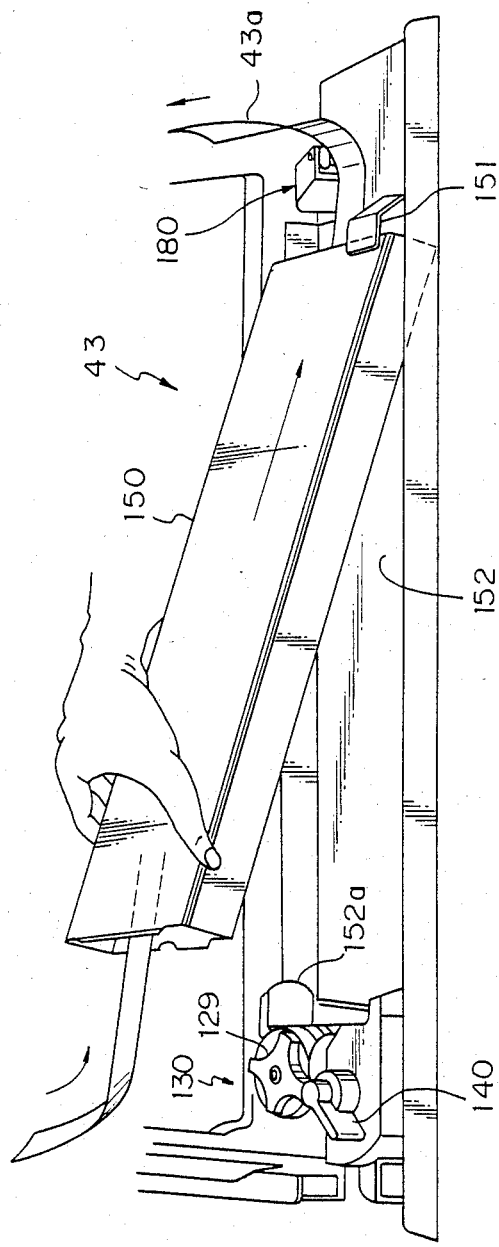

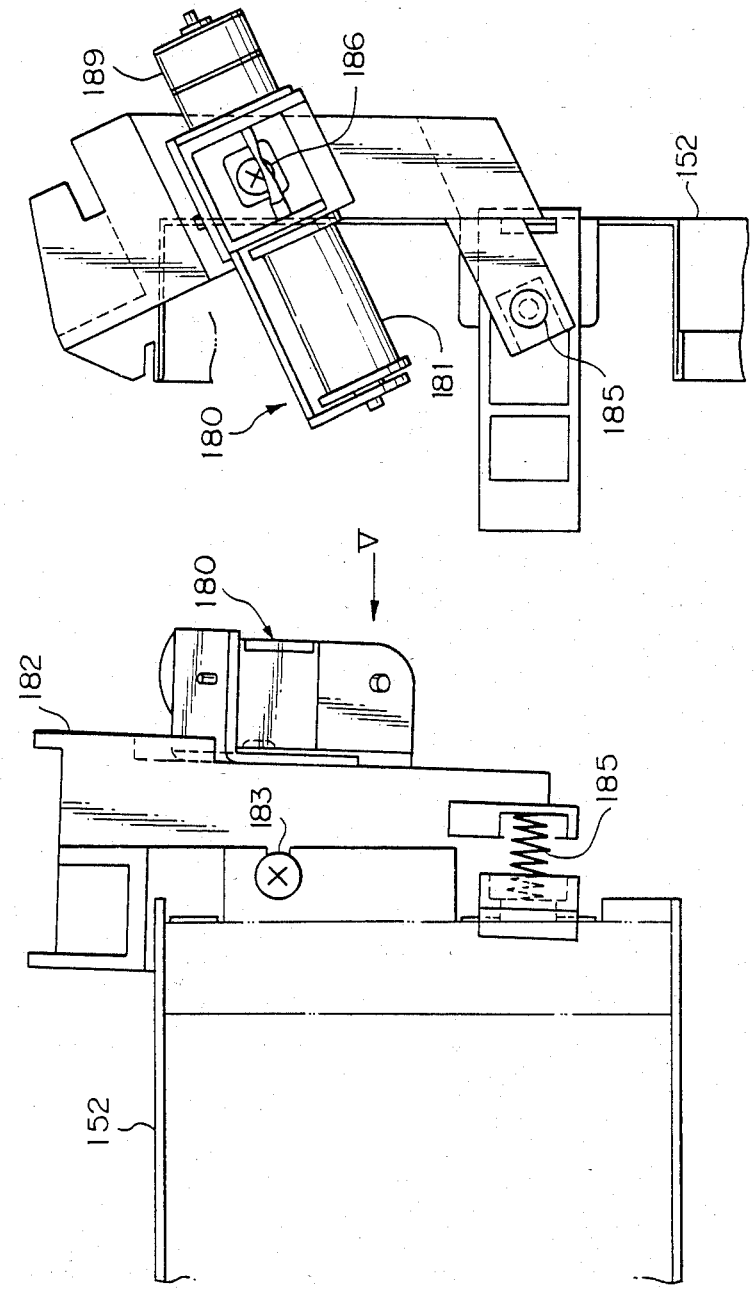

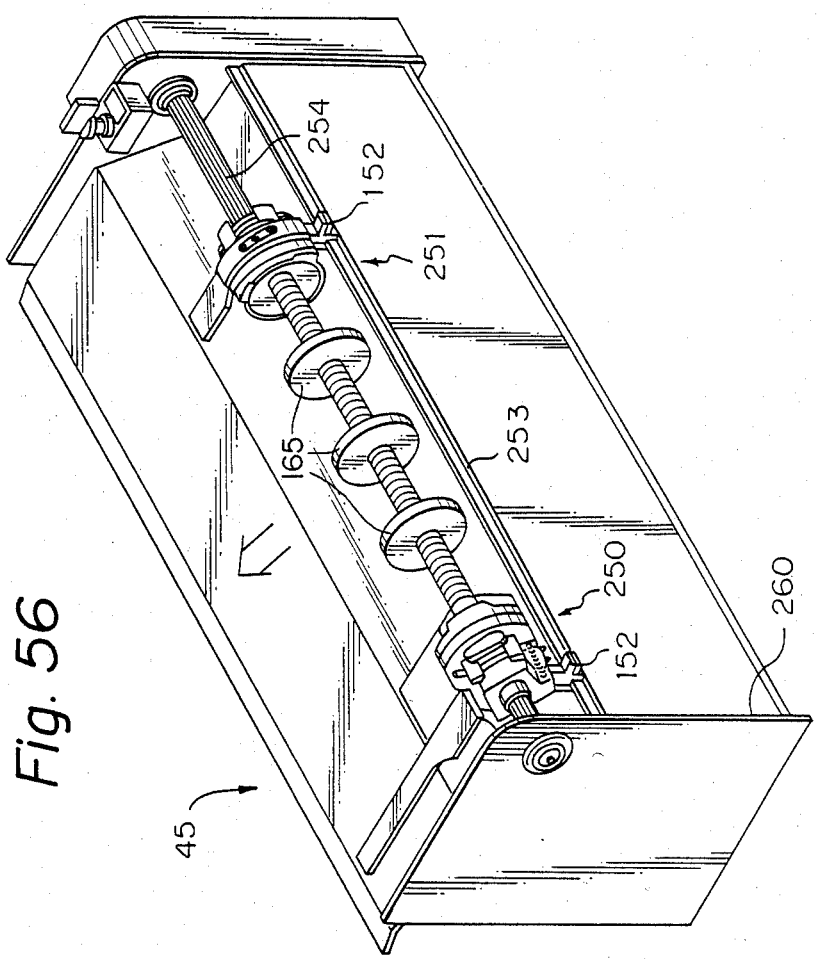

CASING STRUCTURE FOR ELECTRICAL AND MECHANICAL UNITS

BACKGROUND OF THE INVENTION

This invention relates to a casing structure for electrical and mechanical units, and, more particularly, to a casing structure consisting of a main or first casing unit and a sub or second casing unit connected to the first casing unit by hinge members.

A casing structure comprising a casing body and a door of relatively light weight which is connected to the casing body by hinge members is well known. However, it is not appropriate to accommodate some units, such as a line printer, into a casing structure of the above-mentioned type, since a line printer has some mechanical and electrical units accommodated in a main casing, as well as a printing sheet stacked section in front of the main casing and a printed sheet discharging or stacked section at the rear side in the casing. Therefore, the casing required would be of a relatively large volume, so that, if such a casing were constructed as a single casing unit, a large space in the casing would be occupied by the above-mentioned printing and printed sheet stacked sections. Consequently, only a small space in the casing could be used for the important mechanical and electrical units, thereby allowing no space for maintaining and repairing these units.

A casing structure comprising a main casing and a sub casing separable or hingedly connected to each other is also well known. In a type of casing structure wherein the sub casing is mounted on the main casing by means of screws or connected thereto by hinge members, the sub casing is too heavy to manipulate by operators or the main casing is otherwise subjected to the heavy weight of the sub casing. In addition, this type of casing is unstable because of the heavy weight of the sub casing, so that the center of gravity is moved toward the sub casing when the latter is opened.

A casing structure similar to the previous mentioned type is known wherein the sub casing has support rollers or casters on the bottom thereof. With this type of casing, it is easy to manually operate the sub casing due to the supporting rollers. However, it is sometimes difficult to keep the supporting legs or casters of the main casing and the above-mentioned supporting rollers of the sub casing level, since the floor on which the casing structure is situated is not flat in a strict sense. Therefore, it is sometimes necessary to adjust the level of the supporting legs or casters of the main casing everytime the casing structure is relocated.

In the above-mentioned casing structures, it is also difficult to electrically connect for the ground between the main and sub casing units due to an electrostatic shield. Using several lines for this purpose causes a slight electrical noise.

In a casing structure accommodating a line printer, for example, it is usually necessary to cool the various parts thereof, since the line printer comprises: mechanical units, such as a printing magnet, a sheet feeding motor, printing type belts, a ribbon driving motor, and various control magnets; and electrical units, such as a power unit, rectifier and stabilizing circuits, magnet driving circuits, a sheet feeding motor driving circuit; and various control magnets and ribbon driving circuits. All of these mechanical and electrical units may be sources of heat generation. A casing structure is, therefore, usually provided with a power cooling fan at the inside of the casing and cooling air inlet and outlet ducts. In some cases, the air inlet and outlet ducts are also provided with cooling fans, respectively, in order to attain compulsory air circulation.

A casing structure has another important role as a soundproofing cover, since impact sounds are generated from the printing unit, while a printing hammer blows the types against printing sheets. However, a casing structure having air cooling inlets and outlets does not perform effective soundproofing, because the impact sounds tend to leak outside through the cooling air inlet and outlet openings. If foam rubber or some other suitable soundproofing material is provided on the inner walls of the casing in order to obtain effective soundproofing, effective heat radiation would be reduced due to these soundproofing materials. Therefore, some casing structures are provided with special mufflers, which, however, require extra space and increase costs.

SUMMARY OF THE INVENTION

Accordingly, a principal object of the present invention is to provide a new and improved casing structure for electrical and mechanical units, capable of overcoming the above-mentioned disadvantages of the prior art.

Another object of the present invention is to provide a casing structure in which a sub casing can be easily and smoothly pivoted with respect to a main casing through hinge members, which are not subjected to the heavy weight of the sub casing.

Still another object of the present invention is to provide a casing structure capable of effectively cooling electrical and mechanical units accommodated therein, as well as effectively soundproofing, even if a lot of heat sources, such as electrical units, and sound sources, such as printing units, are accommodated in the casing.

According to the present invention, there is provided a casing structure for accommodating electrical and mechanical units including heat and sound sources, comprising at least first, second and third compartments having respective air inlets and outlets, said first compartment being connected to said second compartment which is connected in turn to said third compartment, through respective connecting passages including their air outlets and inlets to constitute an air flow passage through these compartments; a heat source accompanying a sound source arranged in said intermediate or second compartment; and an air cooling fan provided in the air flow passage casing in the vicinity of said heat source, so that the cooling air is circulated through said air passage and said heat source is compulsorily cooled by said cooling fan.

It is advantageous that said heat source accompanying the sound source be a printing unit including a type belt driving device having a type belt installed between a driving pulley and an idle pulley; a printing sheet feeding device for feeding the printing sheet along the type belt; an ink ribbon assembly for bringing an ink ribbon in front of the type belt; and a hammer-magnet assembly including hammers for hitting the type belt and magnets for actuating the hammers.

In an embodiment of the present invention, said first compartment accommodates an electrical control unit for controlling the drive of said printing unit and a power unit for driving said printing unit, and said third compartment accommodates printing or printed sheet for the printer.

It is advantageous that said first and second compartments are defined in a first casing unit, said third compartment and a compartment or chamber accommodating the air cooling fan are defined in a second casing unit, and said second casing unit is connected to said first casing unit by hinge members so as to be able to open and close with respect to said first casing unit.

In an embodiment of the present invention, said first casing unit comprises a bottom portion which horizontally extends from a body of the first casing unit, said extended bottom portion has an upper horizontal metal surface on which said second casing unit is slidingly mounted to be opened and closed so that a metal bottom wall thereof contacts with the upper surface of the extended bottom portion of the first casing unit.

In another embodiment, said first and second casing units are provided with magnet packing elements, respectively, on the abutting surface between said first and second casing units, said packing elements define two rows of soundproofing seals when the second casing unit is closed with respect to the first casing unit.

BRIEF DESCRIPTION OF THE DRAWINGS

FIGS. 1 through 7 illustrate a casing structure for a line printer according to the present invention, wherein:

FIG. 1 is a schematic cross-sectional view of the casing structure;

FIG. 2 is a rear perspective view of the casing structure;

FIG. 3 is another rear perspective view of the casing structure with a second casing unit B opened from a first casing unit A;

FIG. 4 is still another rear perspective view of the casing structure with a rear cover 23B opened from the second casing unit B;

FIG. 5 is a perspective view of the second casing unit B;

FIG. 6 is a front perspective view of the casing structure in which an upper front cover and the rear cover are removed; and FIG. 7 is a front perspective view of the casing structure with a front door 23a opened.

FIGS. 8 and 9 illustrate soundproofing seals; wherein:

FIG. 8 is a schematic sectional view of the casing structure having such seals; and FIG. 9 is a cross-sectional view of the soundproofing seal.

FIGS. 10 through 13 illustrate a cover opening and closing mechanism, wherein:

FIG. 10 is a schematic view showing the principle of the mechanism;

FIG. 11 is a perspective view of a lever in this mechanism;

FIG. 12 is an exploded perspective view of this mechanism; and,

FIG. 13 is a perspective view of a guide plate having a guide slot.

FIGS. 14 through 23 illustrate a printing unit assembly of a line printer; wherein, FIG. 14 is a perspective view of the printing unit;

FIG. 15 is a schematic, side elevational view of the printing unit;

FIG. 16 is a top plan view of the printing unit;

FIG. 17 is a cross-sectional view of positioning means used in this printing unit;

FIG. 18 is a partial side view of the printing unit;

FIG. 19 is a cross-sectional view along a line IX—IX in FIG. 18;

FIG. 20 is a cross-sectional view along a line XX—XX in FIG. 19;

FIG. 21 is a schematic sectional view of the line printer showing a sheet braking/pushing means; and, FIGS. 22 and 23 are exploded perspective views of another embodiment of the printing unit.

FIGS. 24 through 34 illustrate a type belt assembly in the line printer, wherein:

FIG. 24 is a schematic plan view of the printing unit;

FIG. 25 is a perspective view of a type belt;

FIG. 26 is a schematic view showing printing processes in the line printer;

FIG. 27 is an exploded perspective view of an idle pulley assembly;

FIG. 28 is an exploded perspective view of an idle pulley loosening means provided with a wax holder;

FIG. 29 is a schematic plan view of means for applying wax to the type belt;

FIG. 30 is a cross-sectional view of an idle pulley supporting device;

FIG. 31 is a perspective view of a sliding and swinging support member for an idle pulley shaft;

FIG. 32 is a partial perspective view of the idle pulley supporting device;

FIG. 33 is a cross-sectional view of a drive pulley supporting device; and

FIG. 34 is an exploded perspective view of the drive pulley supporting device.

FIGS. 35 through 38 illustrate a printing hammer and magnet assembly, wherein:

FIG. 35 is a schematic, side elevational view of the printing hammer and magnet assembly;

FIG. 36 is an exploded elevational view partially showing in section the printing magnet assembly;

FIG. 37 is a perspective view of armature fingers of the printing magnet assembly; and FIG. 38 is a schematic plan view showing respective modules of units in the printing magnet assembly.

FIGS. 39 through 55 illustrate an ink ribbon assembly of the line printer, wherein:

FIG. 39 is a perspective view of an ink ribbon cartridge being inserted into a ribbon case;

FIG. 40 is a partial side view of the ink ribbon cartridge;

FIG. 41 is a perspective view of the ink ribbon cartridge having been inserted into the ribbon case;

FIG. 42 is a plan view of an ink ribbon driving device;

FIG. 43 is a plan view of a tension roller in the ink ribbon driving device;

FIG. 44 is a cross-sectional view along a line IV—IV in FIG. 43;

FIG. 45 is schematic plan view of the ribbon drive in the driving position;

FIG. 46 is a schematic plan view showing a cam position in the ribbon driving condition;

FIG. 47 is a schematic plan view of the ribbon drive in the inoperating condition;

FIG. 48 is a schematic plan view showing a cam position in the inoperating condition;

FIG. 49 is a perspective view of an ink ribbon cartridge;

FIG. 50 is a perspective view of a slider;

FIG. 51 is a top plan view of the slider;

FIG. 52 is a cross-sectional view along a line II—II in FIG. 51;

FIG. 53 is a perspective view of an ink ribbon braking means;

FIG. 54 is a plan view of a ribbon case outlet including a ribbon detector; and, FIG. 55 is a side view seen from an arrow V in FIG. 54.

FIGS. 56 through 66 illustrate a printing sheet feeding device in the line printer, wherein:

FIG. 56 is a perspective view of a printing sheet feeder;

FIG. 57 is a schematic, elevational side view of a sheet tractor;

FIG. 58 is a perspective view of a guide member for the printing sheet;

FIGS. 59, 60 and 61 are views seen from arrows IX, O, and I in FIG. 58, respectively.

FIG. 62 is a schematic, side elevational view of the sheet feeder with the guide member mounted thereon;

FIG. 63 is a perspective view of the sheet feeder;

FIG. 64 is a schematic, side elevational view of the sheet feeder including a sheet braking device;

FIG. 65 is a partial enlarged view of the braking device shown in FIG. 64; and

FIG. 66 is a schematic perspective view of the sheet braking device.

DETAILED DESCRIPTION OF THE PREFERRED EMBODIMENTS

Casing Structure

Figure 1:
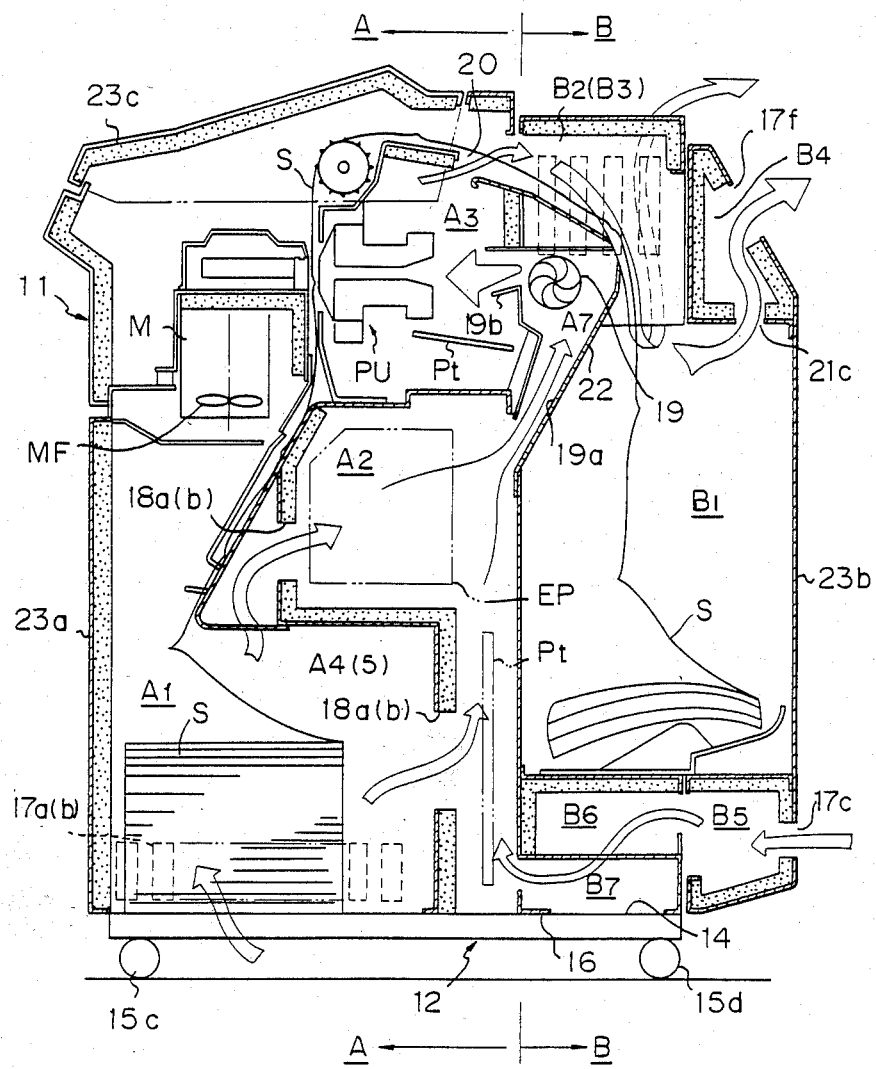
Figure 2:
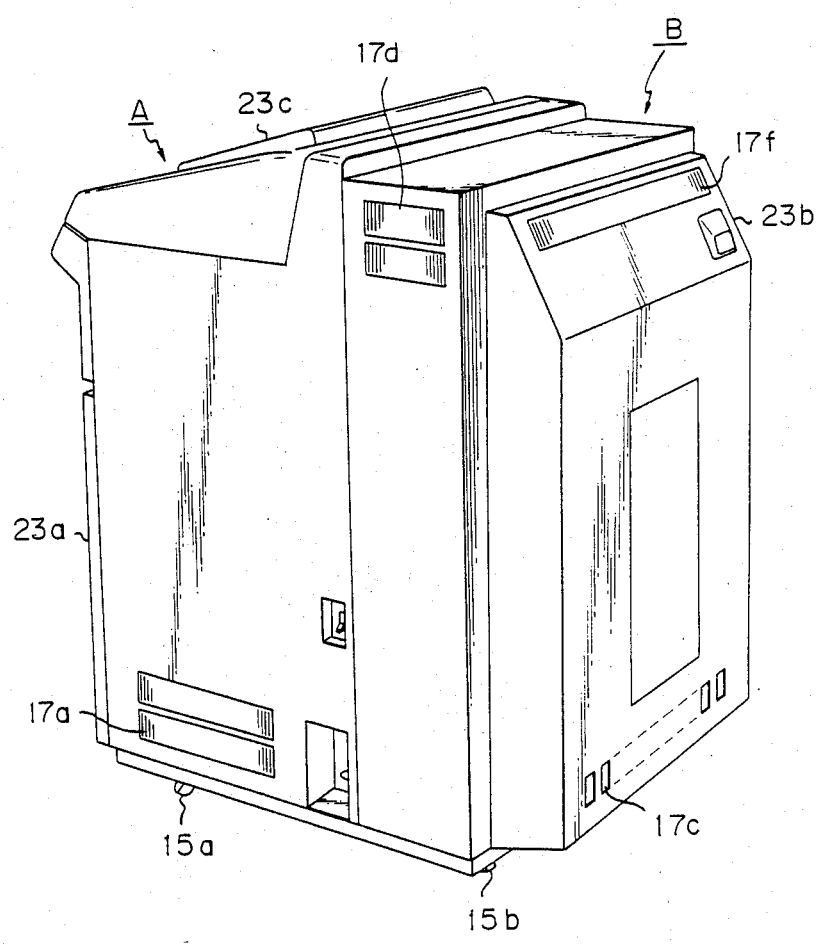

Referring now to FIGS. 1 through 7, a casing structure according to the present invention consists of two parts, i.e., a main or first casing unit A and a sub or second casing unit B. The main casing unit A has a body portion 11 and a bottom portion 12 which horizontally extends from the front face 13 (FIG. 3) of the body portion 11. The extended bottom portion 12 has an upper horizontal surface 14 on which the second casing unit B is slidingly mounted by vertical hinge members 3 (FIG. 3) secured to one of the vertical edges of the first casing unit A.

When the second casing unit B is pivoted to close the front face 13 of the first casing unit A (FIGS. 1 and 2), the horizontal bottom surface 16 (FIGS. 1 and 3) of the second casing unit B occupies the whole area of the upper horizontal surface 14 of the first casing unit A. The second casing unit B can be opened by pivoting on the hinge members 3 (FIG. 3) and sliding on the upper horizontal surface 14 of the first casing unit A. However, the second casing unit B is prevented from moving more than 90 degrees and leaving the surface 14 by means of a stopper member (not shown).

At the four corner edges of the bottom portion of the main casing unit A, which includes the extended bottom portion 12, four supporting legs or rolling casters 15a, 15b, 15c, and 15d (FIGS. 1 and 2) are provided. As a matter or fact, these legs of rolling casters always support all the weight of casing units A and B, even when the second casing unit B is either open or closed.

It is advantageous that the horizontal upper surface 14 of the first casing unit A and the horizontal bottom surface 16 of the second casing unit B are both an electro-plated metal, such as steel or nickel plated surfaces, but not painted surfaces, so that an electrical ground base can be easily obtained between these surfaces.

Since the hinge members 3 (FIG. 3) are arranged perpendicularly to the upper horizontal surface 14 of the main casing unit A, the sub casing B can be easily and smoothly manipulated by the operator's hand (not shown). Therefore, when the main or sub casing unit is to be loaded with the mechanical or electrical units of a line printer, or when these loaded units must be repaired, the sub casing unit B can be opened with respect to the main casing unit A such that at least a part of the bottom surface 16 of the sub casing unit B is positioned on the upper surface 14 of the main casing unit A. During this open state of the casing units A and B, the necessary operations can proceed. Therefore, almost all the weight of the sub casing unit B is exerted on the upper surface 14 of the main casing unit A, while the hinge members 3 are no longer subjected to the weight of the sub casing unit B, when the unit B is slid on the upper surface 14 of the main casing unit A. In addition, the unevenness or roughness of the floor no longer influences the level of the supporting legs or casters 15a, 15b, 15c, and 15d.

Figure 6:
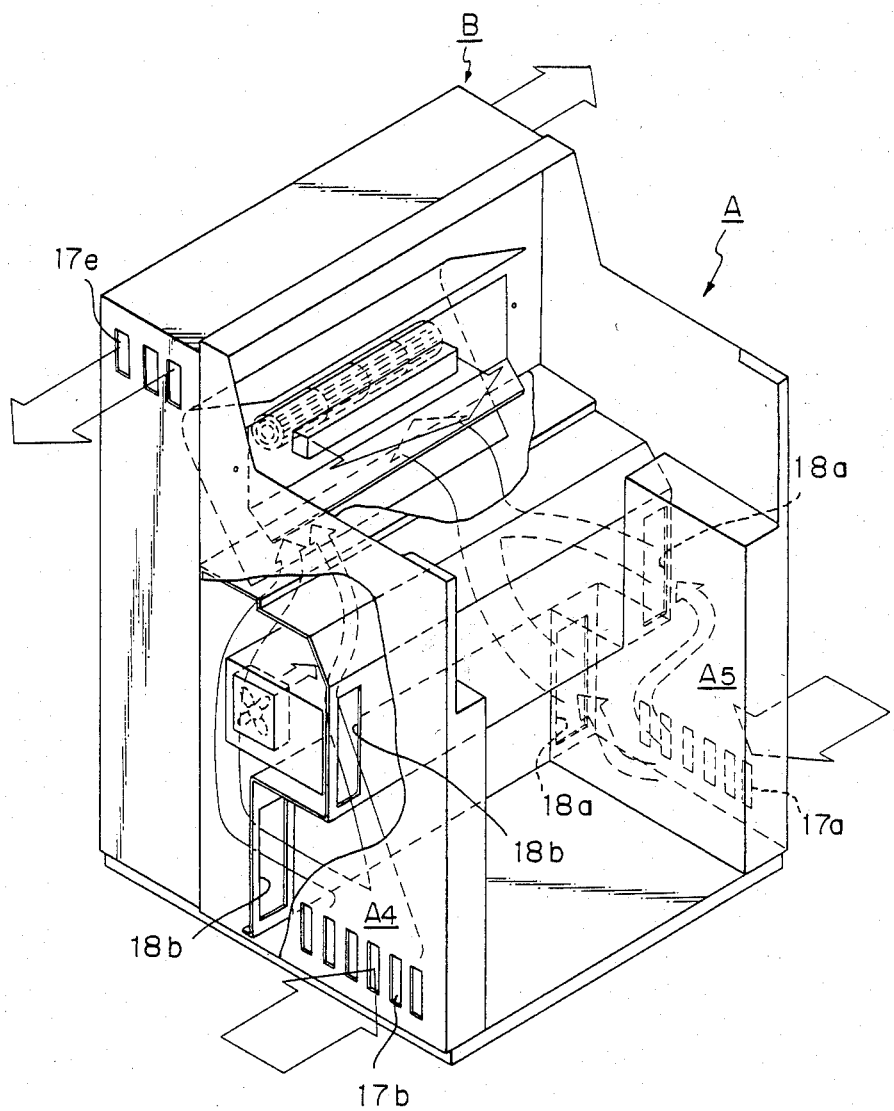

The main casing unit A includes various compartments, such as a printing sheet stacked section A1, an electrical units mounting section (first compartment) A2, a mechanical units mounting section (second compartment) A3, and cooling air inlet ducts A4 and A5 (FIG. 6). The sub casing unit B also includes various compartments, such as a printed sheet stacked section (third compartment) B1, cooling air outlet or discharge ducts B2, B3, and B4, and cooling air inlet ducts B5, B6, and B7. The cooling air inlet ducts A4, A5, and B5 have inlet openings 17a, 17b, and 17c, respectively, opened to the outside of the casing structure. The cooling air outlet ducts B2, B3, and B4 have outlet openings 17d, 17e, and 17f, respectively, opened to the outside of the casing structure. Contrary to this, the compartments A1, A2, A3 and B1 are so-called closed structures.

The air inlet ducts A4 and A5 formed at the right and left sides, respectively, of the compartment A1, as seen from FIG. 6, are connected to the compartment A2 through openings 18a and 18b (FIGS. 3 and 6), respectively. The inlet duct B5 is also connected to the compartment A2 through the ducts B6 and B7. The compartment A2 is, in turn, connected to the compartment A3 through a passageway 19a and a compartment A7 which is formed in the sub casing unit B and in which a cross-flow fan 19 is accommodated. The compartment A3 is, in turn, connected to the compartment B1 of the sub casing unit B through an outlet 20 formed above the cross-flow fan 19. The compartment B1 is also, in turn, connected to the cooling air outlet ducts B2 and B3, respectively, formed at the upper right and left sides, respectively, in the sub casing unit B, through openings 21a and 21b (FIG. 4) formed at the bottom of the outlet ducts B2 and B3, respectively. The compartment B1 is also connected to the cooling air outlet duct B4 through openings 21c.

In order to reduce the level of sound generated in a printing unit provided in the compartment A3, the air outlet ducts B1, B2, B3, and B4 are so constructed to form a labyrinth that the cooling air turns many times during it flows from the compartment B1 through ducts B2 and B3, and the duct B4.

As will be understood from the aforementioned description, a cooling air passage is formed from the air inlet ducts A4 and A5 or the air inlet ducts B4, B5 and B6, through the compartment A2 including the compartment A7 of reduced cross-section in which the cross-flow fan 19 is accommodated, the compartment A3, the outlet 20, and the compartment B1 to the cooling air outlet ducts B2, B3, and B4. Therefore, when the cross-flow fan 19 is rotated, cooling air is introduced from the outside to the air inlet ducts A4 and A5 through the openings 17a and 17b (FIG. 6), and to the air inlet ducts B5, B6, and B7 through the openings 17C. After having cooled various parts of the heat sources, the cooling air is discharged to the outside partially from the outlet ducts B2 and B3 through the openings 17d and 17e (FIG. 4), and partially from the outlet duct B4 through the openings 17f. As will be understood, the inlet ducts B5, B6, and B7 also constitute a labyrinth.

Since the cross-flow fan 19 is provided in the compartment A7 in the above-mentioned cooling air passage, especially the smallest cross-section of the cooling air passage, negative and positive pressure zones are formed in the upstream and downstream sides thereof, respectively, so that effective ventilation of cooling air can be attained with the single cooling fan. In addition, the speed of cooling air flow can be increased in the vicinity of the cooling fan, especially in an outlet 19b of the cross-flow fan 19. Therefore, it is advantageous that the heat generating parts be situated around these areas. As mentioned hereinafter, most of the heat and sound generating sources or parts are in fact situated in the above-mentioned area, i.e., in the compartments A2 and A3.

In the compartment A1 an elongated printing sheet S is stacked and longitudinally folded, while in the compartment B1 the printed sheet S is stacked and longitudinally folded. These sections are not heat generating sources. In the compartment A2, an electrical power unit EP including heat generating sources, such as a power input; a power rectifier circuit; a stabilizing circuit, and an electrical unit including printed circuit boards Pt are provided. In the compartment A3, a printing unit PU including a printing magnet and a magnet driving mechanism, which are main heat and sound sources among this printing unit, are situated near the air outlet of the cooling fan 19. Another printed circuit board Pt is also provided in the compartment A3. A belt driving motor M can be cooled by branched flow of cooling air from the fan 19 through the outer space of the sheet flow passage, or it can also be cooled by cooling blades MF which may be mounted on the belt driving motor M per se.

After having cooled the above-mentioned heat generating parts, the warmed air is discharged through the outlet passage 20 to the compartment B1 and then discharged to the outside through the air labyrinth comprising the air outlet ducts B2, B3, and B4. If necessary, one or more additional cooling fans can be provided, such as in the duct B7 or at other suitable places.

The printing sheet S stucked in the compartment A1 is fed longitudinally as indicated by a line S in FIG. 1 along a sheet guide to the printing unit PU by means of a feeder which will be described later in detail. After having been printed, the sheet S is continuously discharged through the sheet guide to the compartment B1 where the sheet is again stacked and longitudinally folded.

The printing unit PU is an assembly having its width which is, of course, larger than the largest width of the allowable printing sheet suitable to be used in this line printer. Such a printing unit assembly PU is situated in the compartment A3 so that a suitable gap is formed between the printing unit PU and the inner wall of the casing. Therefore, in the compartment A3, the cooling air can be passed through the gap over the printing unit PU, and, then passed through the outlet passage 20 into the compartment B1. An opposite wall 22 of the compartment B1, which defines the compartment A7, which connects the compartment A2 with A3 and in which the cross-flow fan 19 is situated, serves also as a sheet guide in the compartment B1 for the printed sheet S.

Since the direction of the cooling air flow is changed by about 90 degrees from the suction side of the cross-flow fan 19 to the discharge side thereof, and the printing unit PU is relatively long in the direction of printing line, while it is relatively small size in the cross-section as seen in FIG. 1, the particular shape of passage for the cooling air can be advantageously constructed as a muffler having a suitable labyrinth, as described hereinbefore and illustrated in FIGS. 1, 3, 4 and 6.

The particular form of passage is advantageous not only for the cooling air, but also for soundproofing effects. That is, almost all the sources of sound generation are the printing unit PU and the related parts accommodated in the compartment A3 and sound is generated mainly by the printing hammers and the driving or driven members in the printing unit PU. In addition, the cross-flow fan 19, of course, generates a little sound.

According to the particular embodiment of the casing structure of this invention, in the air suction side, the air inlet ducts A4 and A5, and B5, B6 and B7 are provided as soundproofing ducts, and the compartment A2 also serves as a soundproofing duct. On the other hand, in the air discharge side, the compartment B1 for the stacked printed sheet serves as a soundproofing duct and the compartment B2, B3, and B4 cooperate to form a labyrinth of soundproofing ducts by which the sound wave is turned several times and is diminished. Therefore, the level of sound which is to be discharged to the outside from the openings 17a, 17b, 17c, 17d, 17e and 17f is significantly decreased. Providing soundproofing materials on the inner walls of the compartments or casing is, of course, even more effective in reducing the sound level. The compartment A1 neither serves as a cooling air passage nor as a soundproofing duct, but serves only as a printing sheet stacked section.

Figure 4:
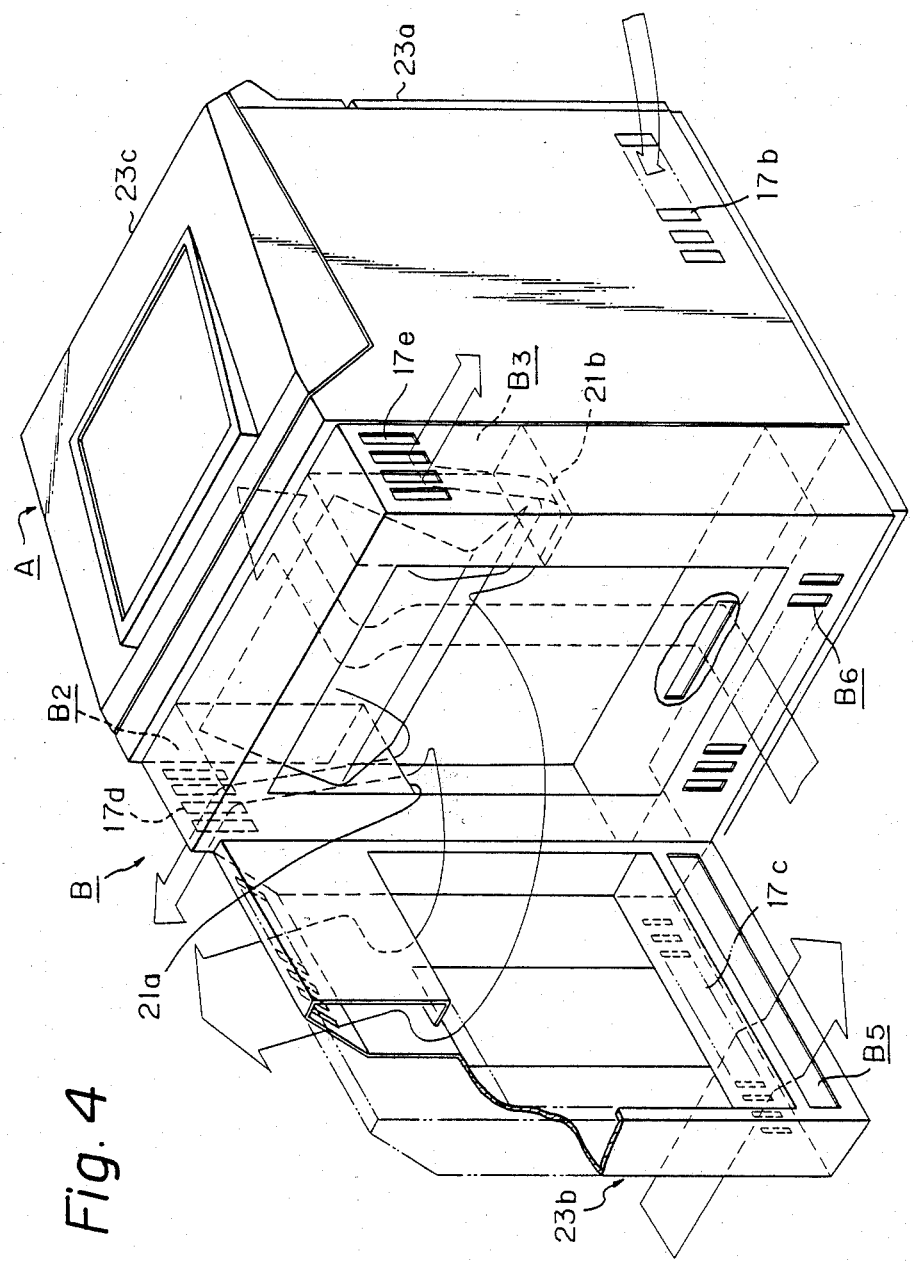
Figure 5:
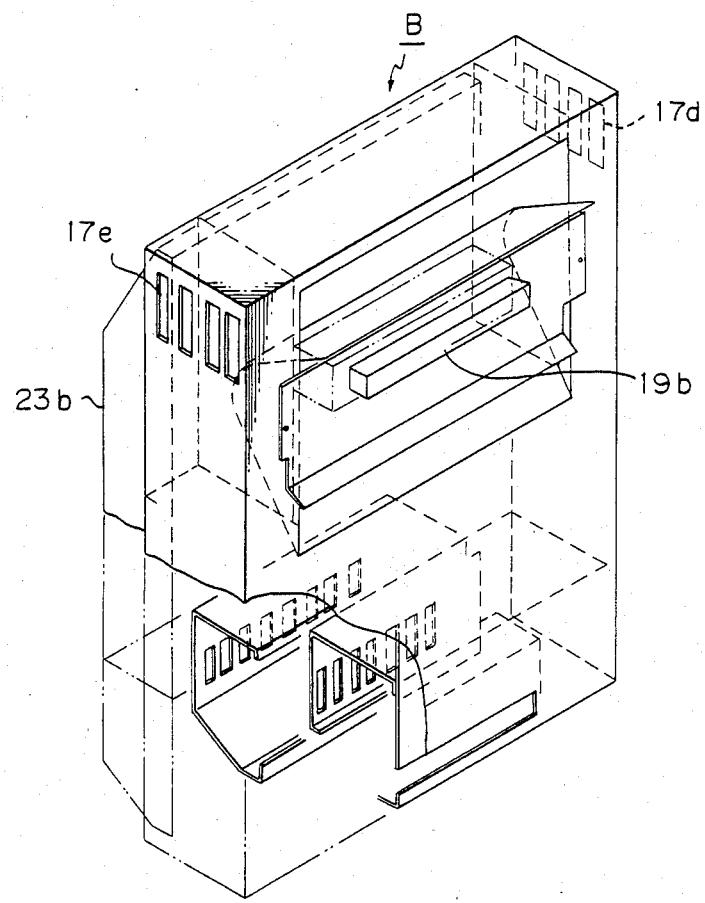
Figure 7:
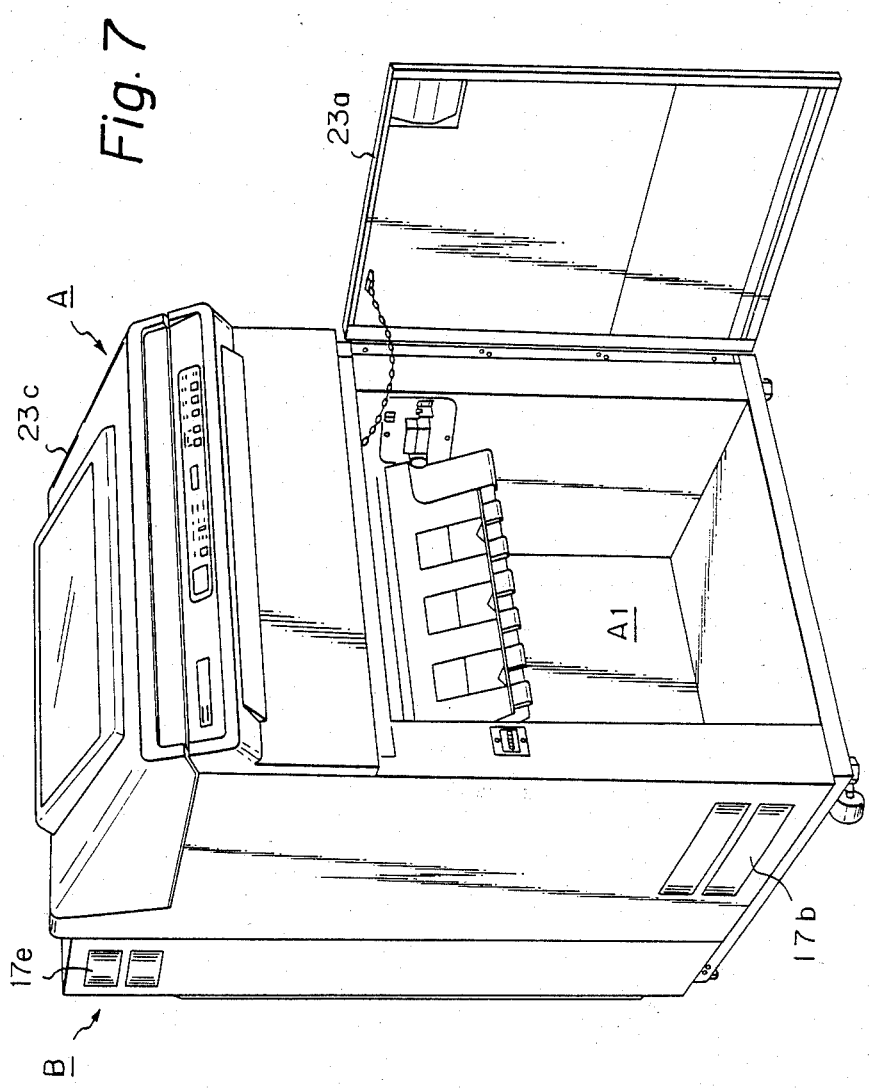

During the printing operation, the main casing unit A, as well as the sub casing unit B, are closed by covers which can be used for loading and unloading the printing and printed sheets. For example, a front lower door 23a can be opened for loading the printing sheets (FIG. 7). On the other hand, a rear door 23b can be opened for unloading the printed sheets (FIG. 4). A front upper cover 23c can also be opened for maintenance.

Soundproofing Seal

Figure 3:
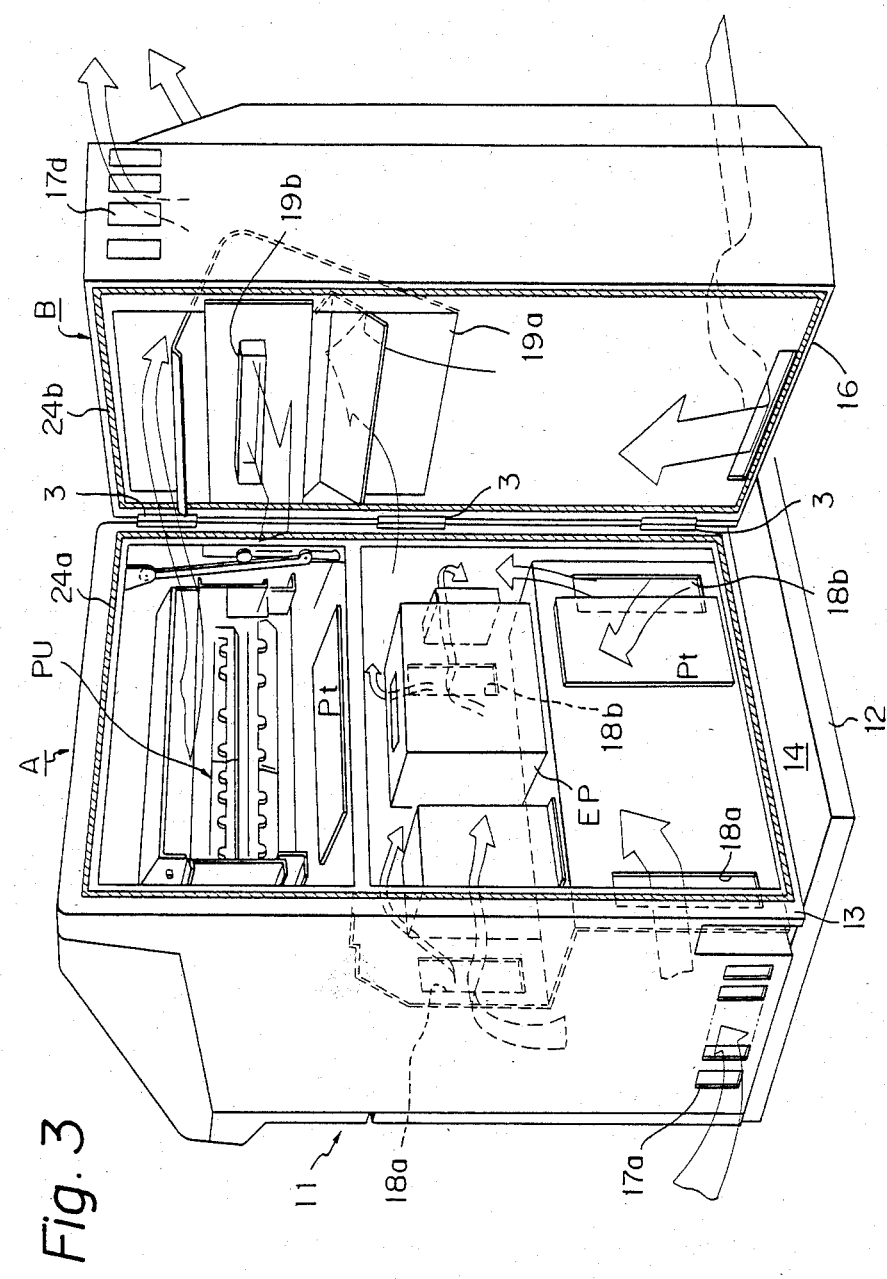
Figure 8:
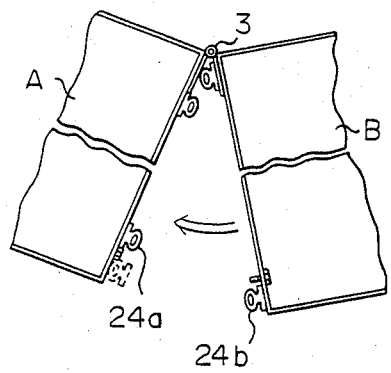

In FIG. 3, the front face 13 of the first casing unit A is provided with a magnet packing element 24a along the rectangular periphery thereof. The opposite face of the second casing unit B is also provided with another magnet packing element 24b along the rectangular periphery thereof. When the casing unit B is closed with respect to the casing unit A, these packing elements 24a and 24b magnetically abut against the opposite faces of the casing units A and B and cooperate to form two rows of soundproofing seals between the casing units A and B, i.e., the packing element 24a being an inner seal, while the packing element 24b being an outer seal, as seen in FIG. 8, whereby a soundproofing passage or space is formed therebetween.

Figure 9:
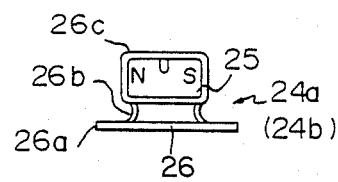

FIG. 9 is a cross-sectional view of either of the magnet packing elements 24a or 24b, in which each of the elements 24a and 24b comprises a flexible magnet core 25, made of ferrite magnet solidized with some rubber, and a holding member 26 made of synthetic rubber or vinyl comprising a base portion 26a, two legs 26b, and a hollow portion 26c into which the magnet core 25 is inserted.

Such soundproofing packing elements can also be provided at other places, such as between the covers or doors 23a, 23b, and 23c, and the opposite faces of the casings or compartments.

Cover Opening and Closing

FIGS. 10 through 13 illustrate a cover opening and closing mechanism for a cover, such as the upper front cover 23c. The cover 23c is mounted on the upper portion of the casing unit A by hinge members 31 and has a pair of arms 32 rigidly secured to the cover 23c, which arms are provided with holes 32a. A single lever 33 is pivotably connected to the cover arm 32, such that pin portions 33a (FIG. 12) provided at one end of the lever 33 are inserted into the holes 32a of the cover arms 32. The other end of the lever 33 is also provided with pin portions 33b (FIG. 12) protruding on both sides. As seen from FIG. 12, a guide roller 34 is rotatably mounted on one of the pin portions 33b and another roller 37 is mounted on the other pin portion 33b.

The guide roller 34 is vertically guided along a guide slot 35a of a guide plate 35 which is rigidly secured to the casing unit A. A rubber stopper or damping or shock absorbing member 36 is mounted on an enlarged slot portion 35b (FIG. 13) at the upper end of the vertical guide slot 35a of the guide plate 35 so as to limit the upward movement of the guide roller 34. A coil spring 38 extends from the roller 37 to a hole 39a of a stationary stay 39 which is rigidly secured to the casing unit A, so that the lower end of the lever 33 is usually urged upwardly.

Figure 10:
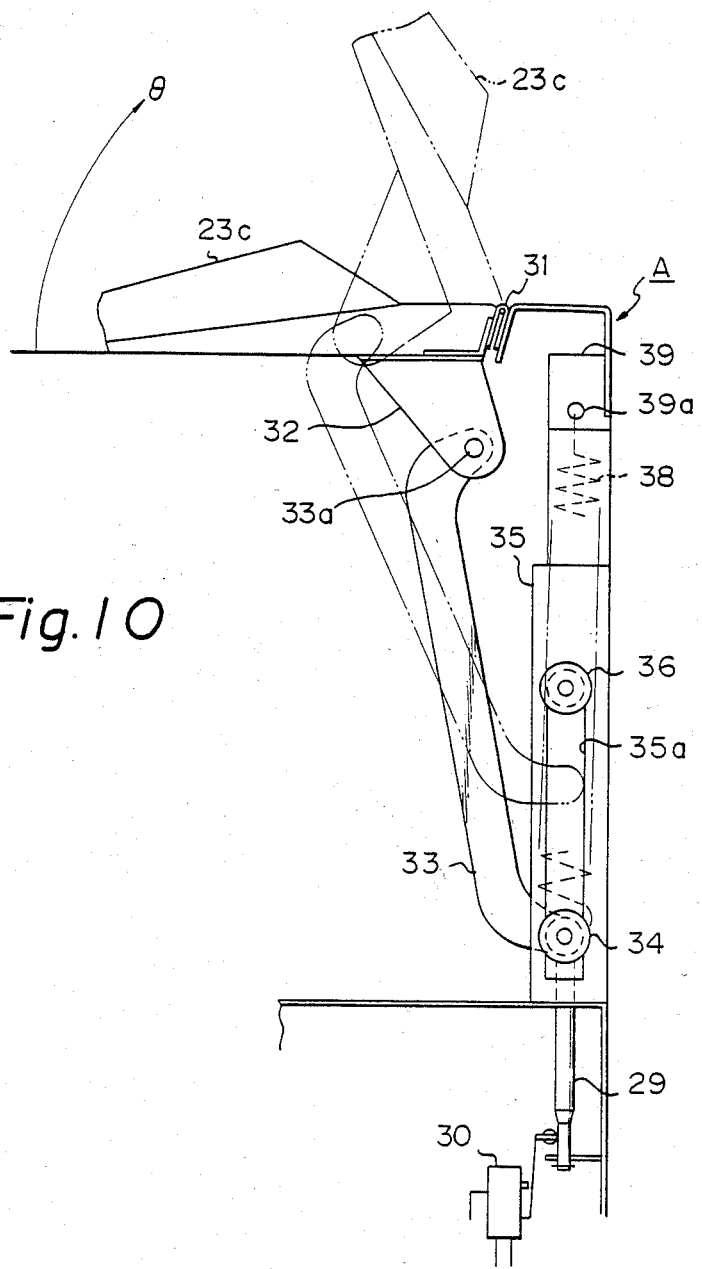
Figure 12:
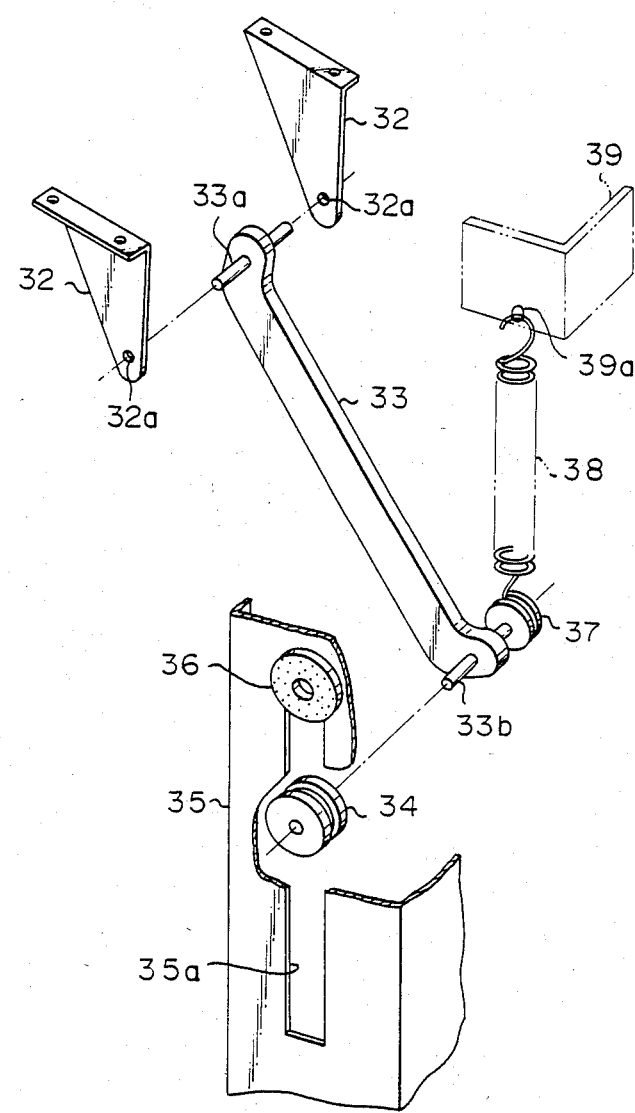
Figure 13:
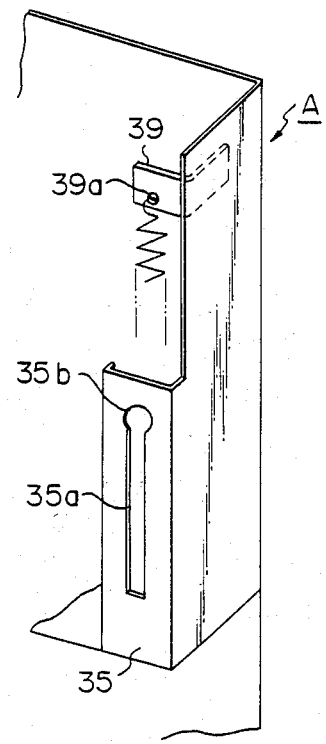

When the cover 23c is in the closed position, as illustrated by a solid line in FIG. 10, the cover 23c is kept closed even though the spring 38 is extended, since the position of the pin portion 33a is at the left hand side with respect to a line passing through the lower pins 33b of the lever 33 and the hinge members 31. In this state, therefore, the spring 38 exerts a force to keep the cover 23c closed.

When the cover 23c is opened a little via the hinge members 31, the position of the pin portion 33a moves from the left side to the right side with respect to the above-mentioned line extending between the lower pin 33b and the hinge members 31. Then, the cover 23c is further opened along angle $\emptyset$ with the help of the spring 38 to the final opened position, where the cover 23c is kept opened, as illustrated by a dotted line in FIG. 10.

Figure 11:
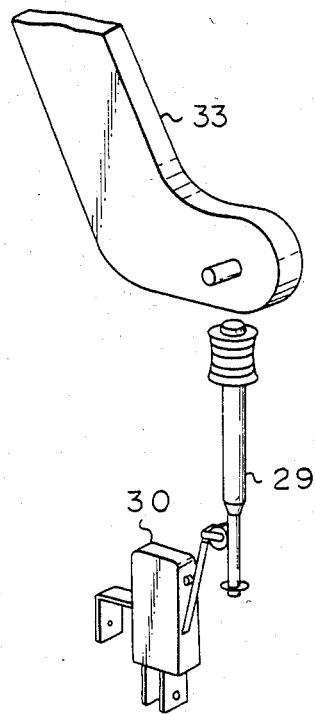

As seen from FIGS. 10 and 11, an actuator rod 29 and a limit switch 30 are provided for detecting whether the cover 23c is opened or closed. The actuator rod 29 is guided vertically along a guide member rigidly secured to the casing body A and is upwardly urged to come into contact with the lower end of the lever 33. The limit switch 30 detects the position of the actuator rod 29 which moves together with the lever 33. The limit switch 30 is connected to a central control unit (not shown) so as to stop the power of the printing unit PU when the cover 23c is open, thereby preventing the sound, which would be generated during the operation of the printing unit PU, from being discharged outside when the cover is opened.

Printing Unit

Figure 14:
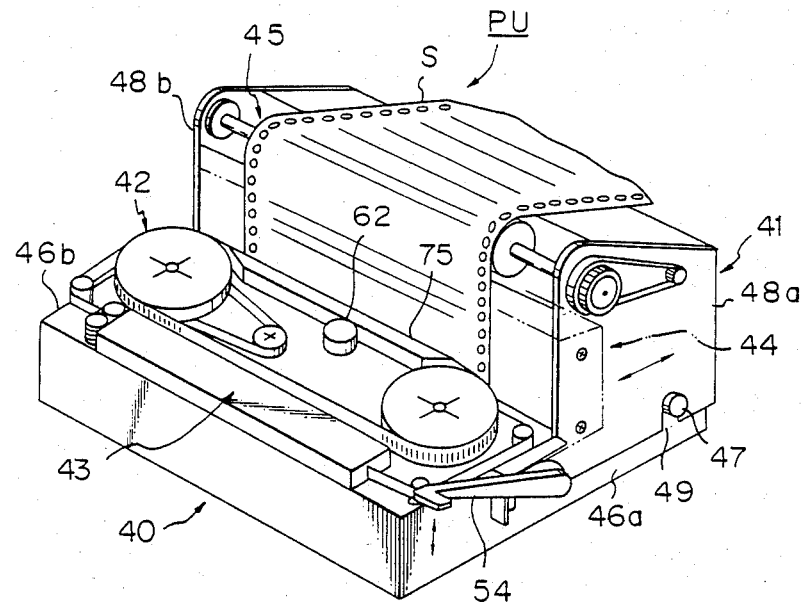
Figure 15:
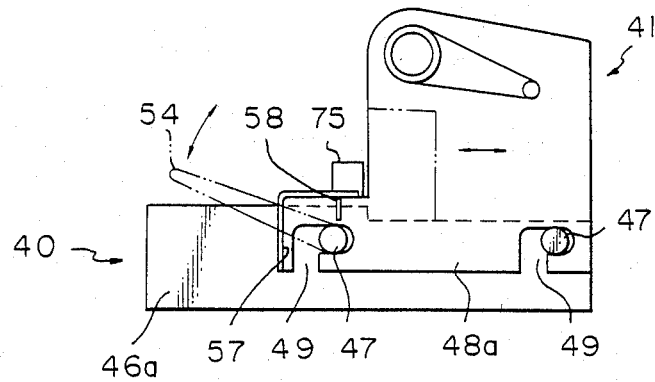

FIGS. 14 through 16 illustrate a printing unit assembly PU which comprises a stationary base unit 40 and a detachable unit 41. On the base unit 40 there are provided with a type belt assembly 42, an ink ribbon assembly 43, etc., while on the detachable unit 41 there are provided a hammer-magnet assembly 44, a sheet feeding mechanism 45, etc.

The base unit 40 has a pair of parallel side plates 46a and 46b, each of which is provided with two guide pins 47 protruding outwardly therefrom. On the other hand, the upper unit 41 has also a pair of parallel side plates 48a and 48b, which can be arranged adjacent and outside the side plates 46a and 46b of the base unit 40, respectively. Each of the side plates 48a and 48b is provided with two L-shaped guide slots 49 at the lower portion thereof, so that the upper unit 41 can be mounted on the base unit 40 by engaging the slots 49 with the corresponding pins 47 of the base unit 40.

As seen from FIGS. 16 and 17, two positioning means 50 are provided in order to situate the detachable unit 41 at a predetermined transverse position with respect to the base unit 40. Each of the positioning means 50 comprises a positioning pin 51 which is rigidly attached to the hammer magnet assembly 44 in the unit 41; a corresponding slot 52 formed in the base unit 40, and an annular resilient member 53 made of rubber arranged around the pin 51 and between the assembly 44 and the base unit 40. When the L-shaped slots 49 of the unit 41 are engaged with the corresponding pins 47 of the base unit 40, the positioning slots 52 are first aligned with the corresponding positioning pins 51. However, the pins 51 and slots 52 are not engaged completely; the assembly 40 (detachable unit 41) is kept away from the base unit 40 due to the resilient members 53, until the unit 41 is finally positioned with respect to the base unit 40 by a lever-eccentric means described below.

Figure 19:
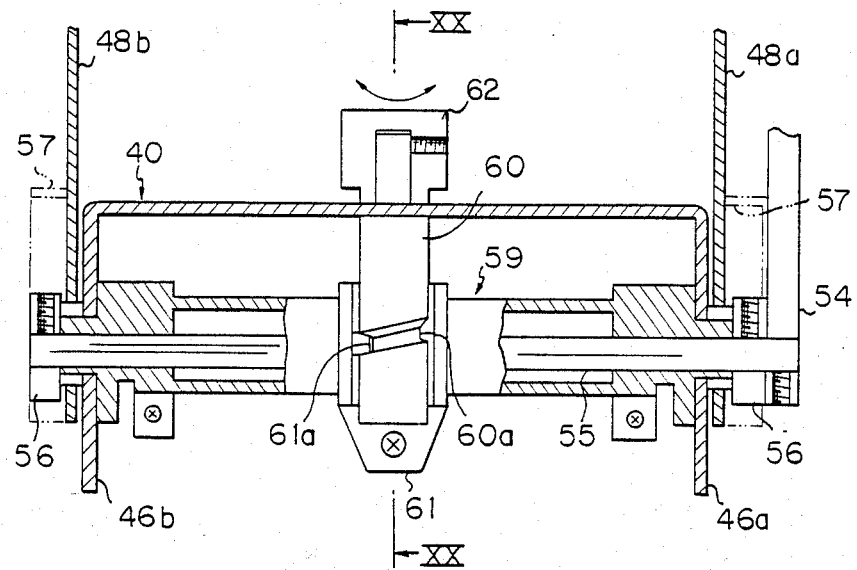
Figure 20:
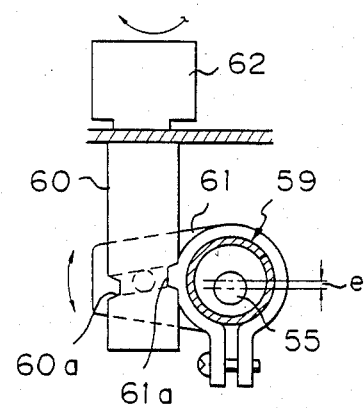

FIGS. 18 through 20 illustrate a lever-eccentric means. A lever 54 is attached to one end of a shaft 55 which transversely passes through the two parallel side plates 46a and 46b (FIG. 14) of the base unit 40 as well as the two parallel side plates 48a and 48b of the movable unit 41. Adjacent these side plates, a pair of cam members 56 are rigidly secured to the shaft 55. On the other hand, the side plates 48a and 48b of the movable unit 41 are provided with cam follower members 57, respectively, which cooperate with the corresponding cam members 56 to situate the movable unit 41 at a predetermined position with respect to the base unit 40. That is, when the lever 54 is moved in the counterclockwise direction in FIG. 18 away from stoppers 58 (FIG. 18), which are also mounted on the side plates 48a and 48b, respectively, the cam members 56 engage with the cam follower members 57 so as to move the movable unit 41 leftward in FIG. 18 against the resilient members 53 (FIG. 17) and to situate the unit 41 at a predetermined position. On the other hand, when the lever 54 is moved in the clockwise direction in FIG. 18 toward the stoppers 58, the cam members 56 disengage from the cam follower members 57 so as to move the movable unit 41 rightward in FIG. 18 with the help of the resilient members 53 (FIG. 17). At the same time, the guide pins 47 (FIG. 15) disengage from the horizontal restraining portions of the guide slots 49 (FIG. 15).

As shown in FIG. 19, the lever shaft 55 is rotatably supported by and inserted into a transverse eccentric member 59 which is, in turn, rotatably supported by the base unit 40. As shown in FIG. 20, the center of rotation of the lever shaft 55 is offset or eccentric by the amount "e" from the center of rotation of the eccentric shaft member 59, which is restricted by a shaft 60 arranged perpendicularly offset thereto and having a helical groove 60a on its outer periphery. Rigidly secured to the eccentric member 59 is a guide pin member 61, into which the shaft 60 is inserted, so that a pin 61a of the member 61 engages with the helical groove 60a of the shaft 60. The shaft 60 is provided with a control knob 62 at the free end thereof, which is on the upper plate of the base unit 40, as also seen from FIG. 14.

Therefore, when the knob 62 is rotated in either direction, the guide pin member 61 and the eccentric shaft member 59 are rotated about their centers of rotation through helical groove 60a and the pin 61a, thereby moving the center of the lever shaft 55 forward or backward with respect to the base unit 40. Consequently, the position of the detachable or upper unit 41 is regulated forward or backward with respect to the base unit 40 by operating the control knob 62.

Figure 21:
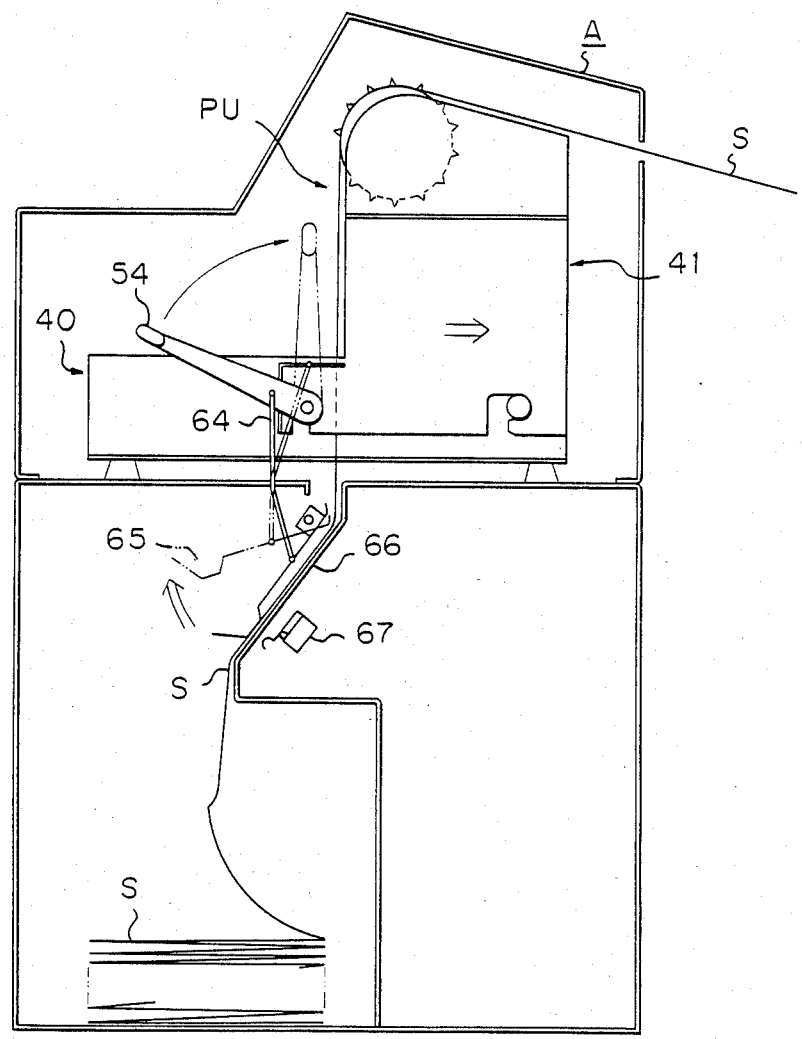

FIG. 21 illustrates an embodiment of a printing sheet breaking/pushing means, in which a wire or rod 64 is pivotably connected to the above-mentioned lever 54. The lower end of the wire 64 is pivotably connected to a pushing plate 65, such as a leaf spring. When the lever 54 is moved downward or in the counterclockwise direction, i.e., when the printer is operating, the pushing plate 65 pushes the printing sheet or form S toward a sheet guide plate 66 in the casing unit A in order to impart an appropriate braking force to the sheet S just before the sheet S is fed to the printing unit PU. In FIG. 21, a limit switch 67 is provided opposite the pushing plate 65 with respect to the sheet guide plate 66 to detect the existence of the printing sheet S. If there is no printing sheet on the sheet guide plate 66, the lever 54 has to be moved upward or in the clockwise direction and the movable unit 41 is to be removed from the base unit 40 in order to reset the sheet S on the printing unit PU. In this case, the pushing plate 65 is, of course, positioned away from the sheet guide plate 66, as illustrated by the dotted line in FIG. 21.

Figure 22:
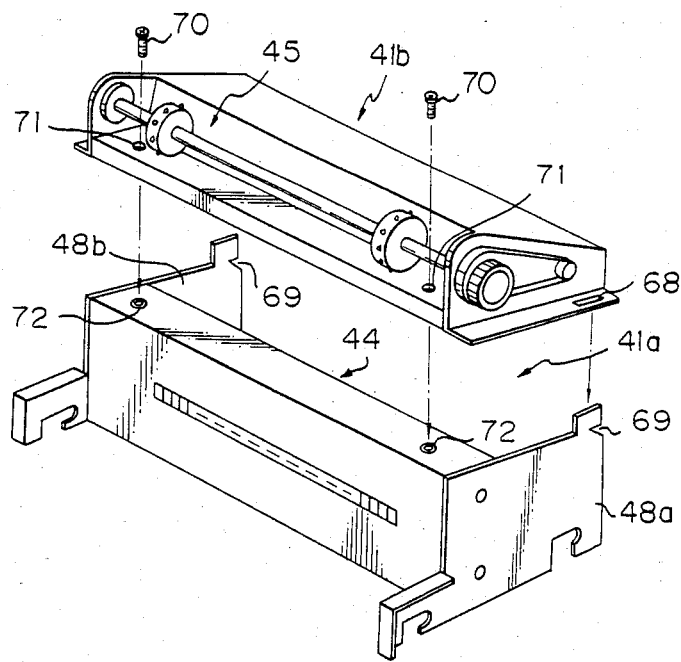
Figure 23:
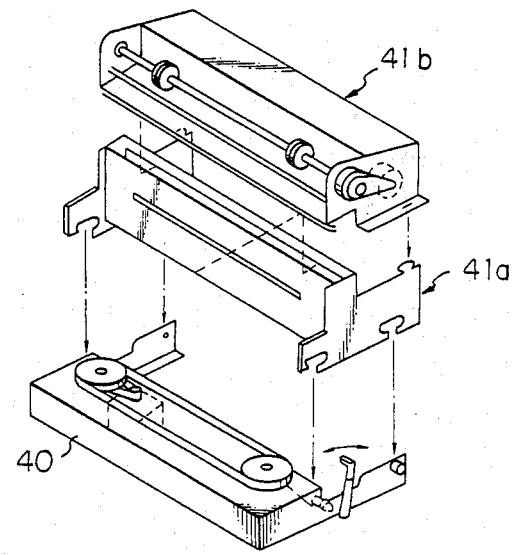

FIGS. 22 and 23 illustrate another embodiment of a printing unit assembly PU, in which the movable or detachable unit 41 is separated into two parts, i.e., a lower unit 41a and an upper unit 41b. The lower unit 41a is provided with a hammer magnet assembly 44, while the upper unit 41b is provided with a sheet feeding mechanism 45. The upper unit 41b is rigidly secured to the lower unit 41a by engaging a pair of guide slots 68 formed in the upper unit 41b with a pair of corresponding notches 69 of the lower unit 41a, and inserting a pair of screws 70 through a pair of holes 71 formed in the upper unit 41b into a pair of corresponding thread holes 72 formed in the lower unit 41a. The movable unit 41, as shown in FIGS. 22 and 23 and consisting of the lower unit 41a with the upper unit 41b rigidly connected thereto, can be mounted on the base unit 40 in the same manner as described hereinbefore with reference to FIGS. 14 and 15.

Type Belt Assembly

Figure 24:
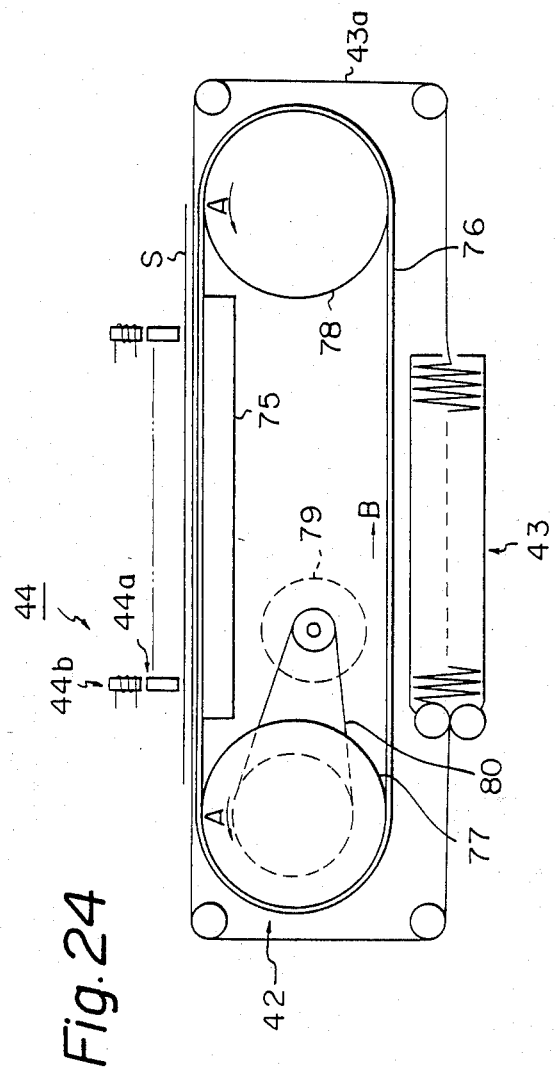

In FIG. 24, there are schematically illustrated a type belt assembly 42; an ink ribbon assembly 43 including an elongated ink ribbon 43a; a platen 75; and a hammer-magnet assembly 44 including a hammer assembly 44a, a magnet assembly 44b, and a printing sheet S.

Figure 25:
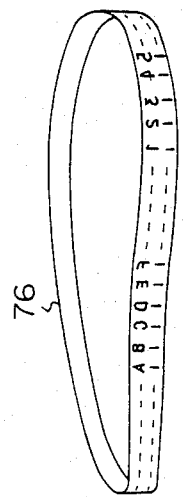

FIG. 25 illustrates a type belt 76 which runs between a driving pulley 77 (FIG. 24) and an idle pulley 78. The driving pulley 77 is driven in the direction A by a belt drive motor 79 via a belt 80, so that the type belt 76 moves in the direction B and the idle pulley 78 also rotates in the direction A, as shown in FIG. 24.

Figure 26:
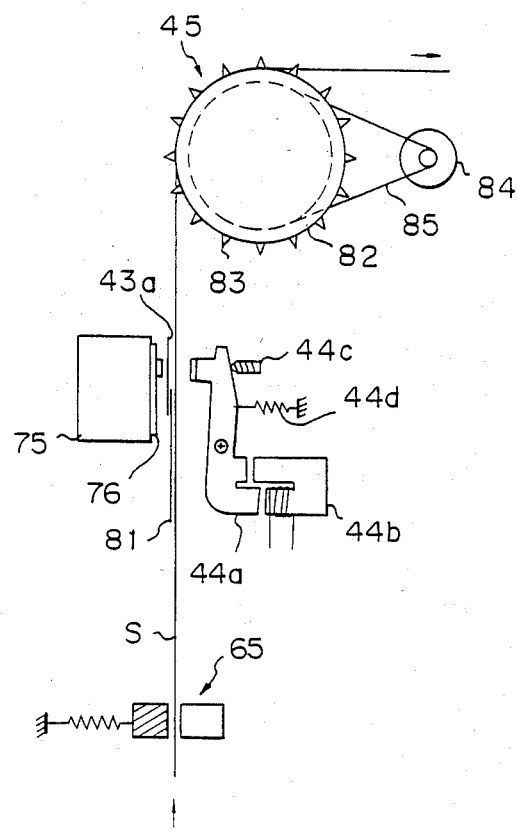

In FIG. 26, reference numeral 65 denotes a braking means for the printing sheet S, such as explained with reference to FIG. 21. Reference numeral 75 denotes a platen; 76 a type belt; 81 an ink ribbon separator; 43a ink ribbon; 44a a hammer; 44b a magnet; 44c a stopper for the hammer; 44d a spring for returning the hammer; 45 a sheet feeder, which includes a tractor 82, a plurality of tractor pins 83 spaced along tractor 82 at the outer periphery thereof, a tractor drive motor 84 and a belt 85. The printing sheet S is periodically fed line by line by the tractor 82 in the direction shown by the straight arrows, while the sheets is printed line by line.

Figure 27:
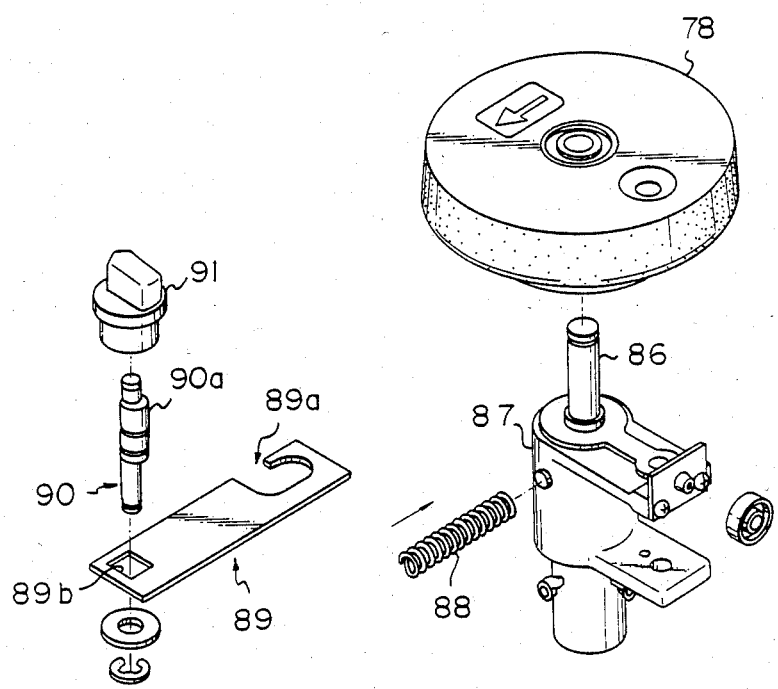

FIG. 27 is a perspective exploded view of a tensioning means for the idle pulley 78, in which the idle pulley 78 is rotatably mounted on a pulley shaft 86 which is supported on a bearing member 87. A spring 88 serves to urge the bearing member 87 so as to impart a tension to the idle pulley 78. On the other hand, a stay member 89 has a guide slot 89a at one end thereof and an opening 89b at the other end thereof. The guide slot 89a is engaged with the pulley shaft 86. On the other hand, a shaft 90 provided with a cam portion 90a is inserted into the opening 89b. A knob or lever 91 is attached to the upper end of the shaft 90.

When the knob 91 is rotated in one direction, the cam portion 90a of the shaft 90 pulls the pulley shaft 86 via the opening 89a of the stay member 89 against the spring 88, so that the distance between the two pulleys 77 and, 78 (FIG. 24) is shortened and therefore, the type belt 76 (FIG. 24) is loosened, during which the type belt 76 can be repaired or replaced with a new one. When the knob 91 is rotated in the opposite direction, the distance between the two pulleys 77 and 78 (FIG. 24) is, of course, increased and, therefore, the type belt 76 is tensioned.

Figure 28:
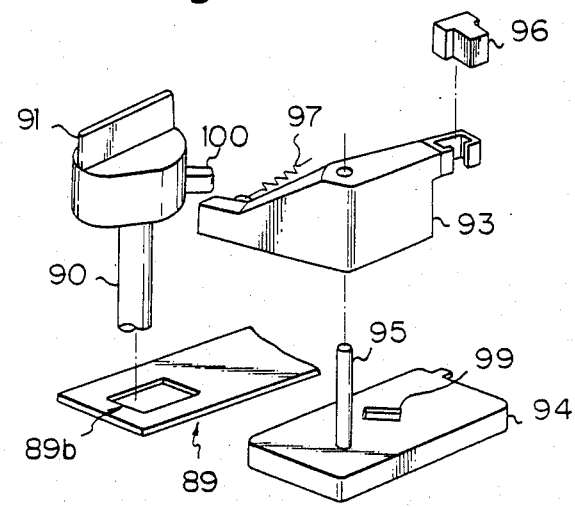
Figure 29:
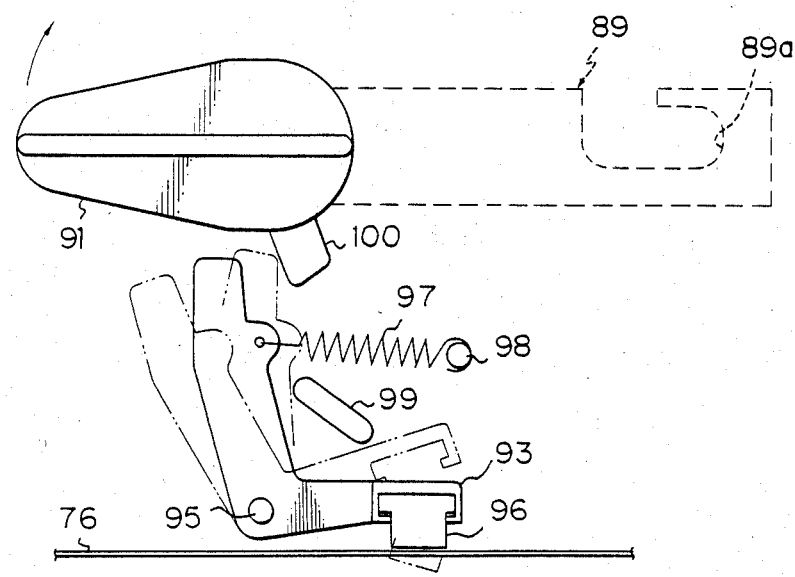

FIGS. 28 and 29 illustrate means for applying a lubrication agent, such as wax, onto the back face of the endless type belt 76. A wax holding member or arm 93 is pivotably mounted on a stationasuch as wax, onto the back face of the endless type belt 76. A wax holding member or arm 93 is pivotably mounted on a stationary flat plate 94 by a pin 95 rigidly secured to the plate 94. A mass of wax 96 is mounted on one end of the arm 93, while the other end of the arm is connected to a spring 97 which is extended to and hooked with a pin 98 (FIG. 29) rigidly mounted on the stationary plate 94, so that the wax 96 is urged into contact with the back face of the type belt 76. A stopper 99 is also mounted on the stationary plate 94 so as to delimit the stroke of pivotable movement of the wax holding arm 93.

On the other hand, the shaft 90 of the belt loosing knob 91 is provided with a guide projection 100. When the knob 91 is rotated in the clockwise direction, as shown by the arrow in FIG. 29 so as to loosen the type belt 76, as mentioned above, the guide projection 100 comes into contact with the arm 93, which is then pivotably moved in the counterclockwise direction in FIG. 29 around the pin 95, against the spring 97, and brings the wax 96 away from the type belt 76, as shown by a dotted line in FIG. 29. When the knob 91 is rotated in the counterclockwise direction in FIG. 29, so as to tension the type belt 76, the arm 93 is, of course, pivoted in the clockwise direction by the spring 97 so as to bring the wax 96 into contact with the back face of the type belt 76, as shown by the solid line in FIG. 29.

Figure 30:
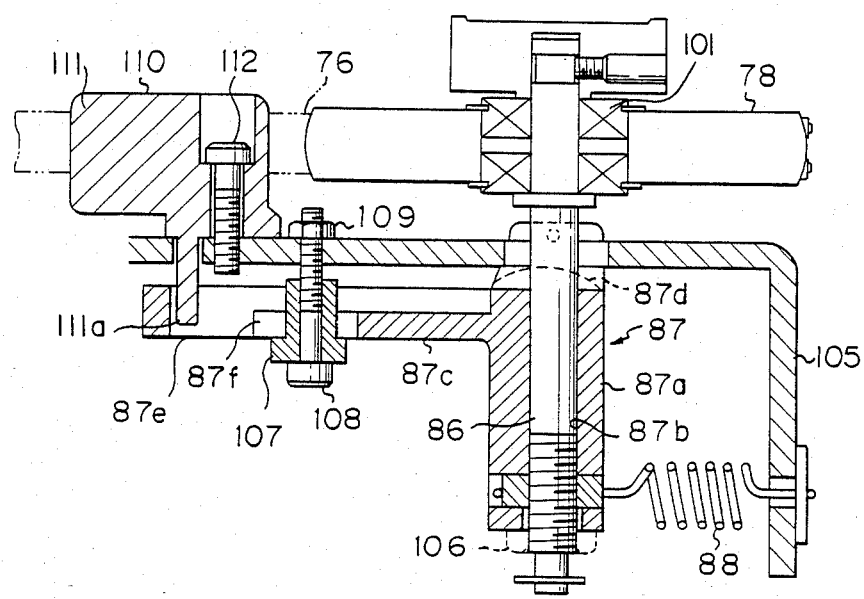
Figure 31:
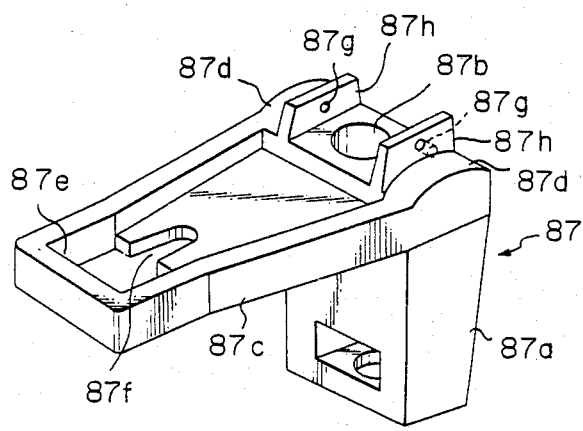
Figure 32:
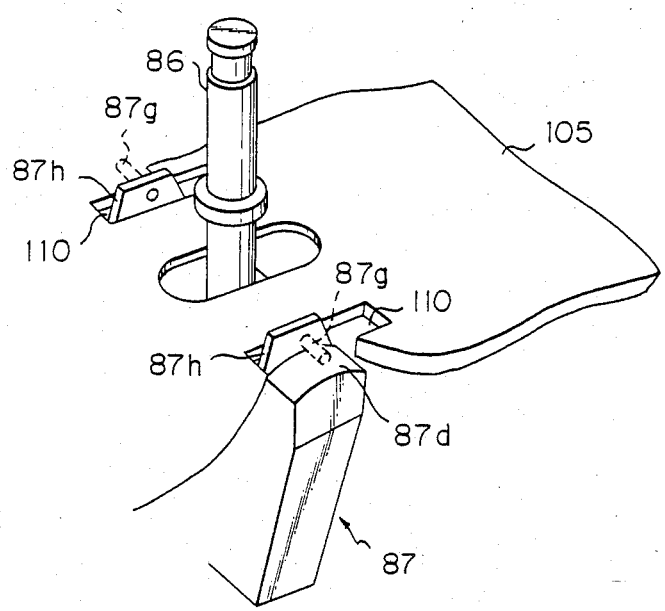

FIGS. 30 through 32 illustrate an idle pulley adjusting means, in which the idle pulley 78 is rotatably supported on the pulley shaft 86 via ball bearings 101, and the pulley shaft 86 is supported on the bearing or support member 87, as mentioned with reference to FIG. 27.

The supporting member 87 has a downwardly extending portion 87a provided with a vertical hole 87b for the pulley shaft 86, a horizontally extending portion 87c, and a pair of round-shaped sliding portions 87d at the top of the vertical portion 87a. The pulley shaft 86 is fixed to the portion 87a by a nut 106 screwed to the lower thread portion of the shaft 86. The sliding portion 87d slidably contacts the unit frame 105, so that the member 87 is allowed to slide and swing in the direction of belt tensioning, as seen from FIG. 32. The lower end of the vertical portion 87a is connected via the spring 88 to a vertical portion of the unit frame 105, as seen in FIG. 30. On the other hand, the opposite end (FIGS. 30 and 31) of the horizontal portion 87c is provided with an opening 87e and a longitudinal slot 87f opened to the opening 87e and extending inwardly.

A flange member 107, which has a flat surface engaging the underside of the slot 87f, is inserted into the slot 87f from the underside. The flange member 107 is secured to the unit frame 105 by a lock bolt 108 for holding the flange member 107 and a lock nut 109, as seen from FIG. 30.

The pulley supporting member 87 is always urged in the counterclockwise direction by the spring 88 about the round-shaped pivot portion 87d. It is, however, restricted by means of the above-mentioned lock bolt 108 and nut 109, so that the idle pulley 78 can be correctly positioned with the pulley shaft 86 in a position just upright with respect to the tensioned type belt 76. A pair of pins 87g on the guide projections 87h can also be employed in place of the round-shaped sliding portion 87d, if any. In this case, the pins 87g slidably contact with the upper surface of the unit frame 105, as seen from FIG. 32. The guide projections 87h protrude upwardly through a pair of guide slots 110 provided in the unit frame 105, so as to delimit the movement of the supporting member 87 in the direction perpendicular to the belt 76.

In FIG. 30, reference numeral 111 denotes another embodiment of belt tensioning knob, which is rotatably mounted on the unit frame 105 about a lock nut 112. The knob 111 has at the lower end thereof a cam portion 111a which is inserted into the opening 87e of the pulley supporting member 87. To tension or loosen the belt 76, the lock nut 112 is loosened and the knob 111 is rotated in either direction, so that the cam portion 111a pulls the member 87 against the spring 88 to loosen the belt 76 or returns the member 87 to the belt tensioning position.

Figure 33:
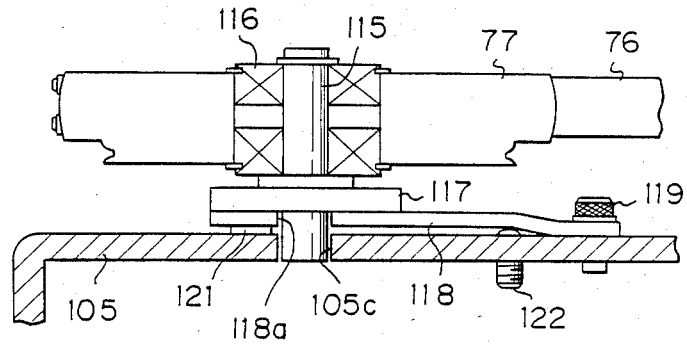
Figure 34:
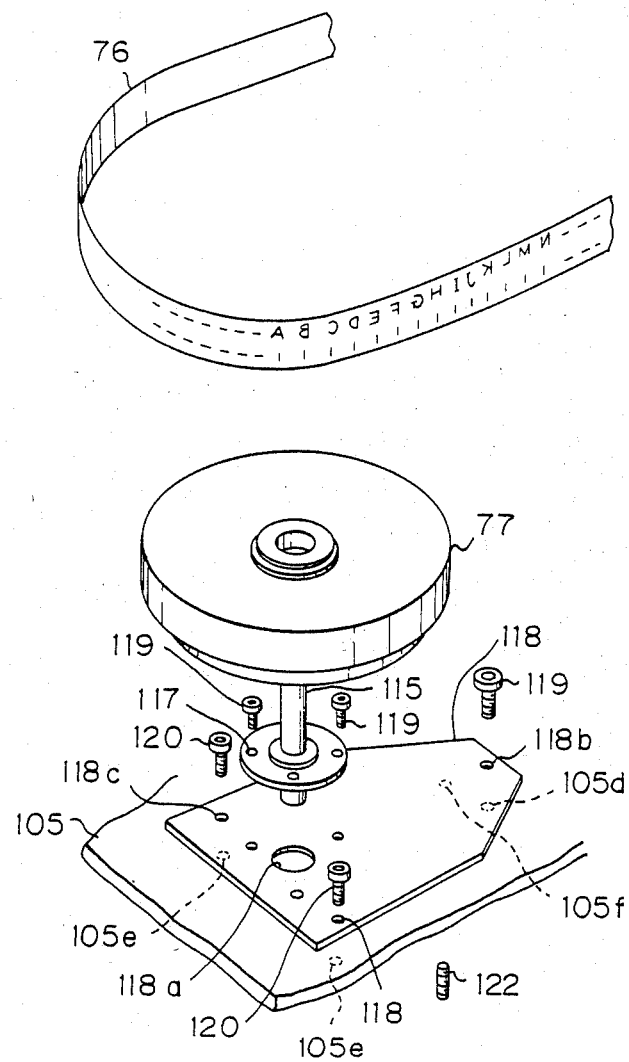

FIGS. 33 and 34 illustrate a driving pulley adjusting means, in which the driving pulley 77 is rotatably supported via ball bearings 116 on a shaft 115, which has a flange portion 117 rigidly secured to a resilient support plate 118, which is made of metal spring plate, by several bolts 119. The lower end of the pulley shaft 115 extends downwardly through a hole 118a formed in the support plate 118 and a hole 105c formed in the unit frame 105. The supporting plate 118 is rigidly secured to the unit frame 105 by a lock bolt 119 extending through a hole 118b and screwed into a thread hole 105d formed in the frame 105 at the inner end of the plate 118, i.e., at the side to which the belt 76 extends. At the other side of the plate 118, a shim 121 having an appropriate thickness is arranged adjacent the shaft 115 and disposed between the support plate 118 and the unit frame 105, and the support member 118 is fastened to the unit frame 105 by means of a pair of bolts 120 extending through holes 118c formed in the support plate 118 and the above-mentioned shim 121 (FIG. 33) and screwed into thread holes 105e of the unit frame 105.

In this condition, the pulley shaft 115 is a little inclined to the right (in FIG. 33) at the top thereof. However, it is adjusted to the accurate upright position by an adjusting screw 122 which extends upwardly through the unit frame 105 to the lower surface of the supporting plate 118 at an appropriate position between the shaft 115 and the lock bolt 119. Consequently, the position of the driving pulley 77 can be adjusted by the screw 122 which engages with a thread hole 105f of the unit frame 105.

Printing hammer and magnet

Figure 35:
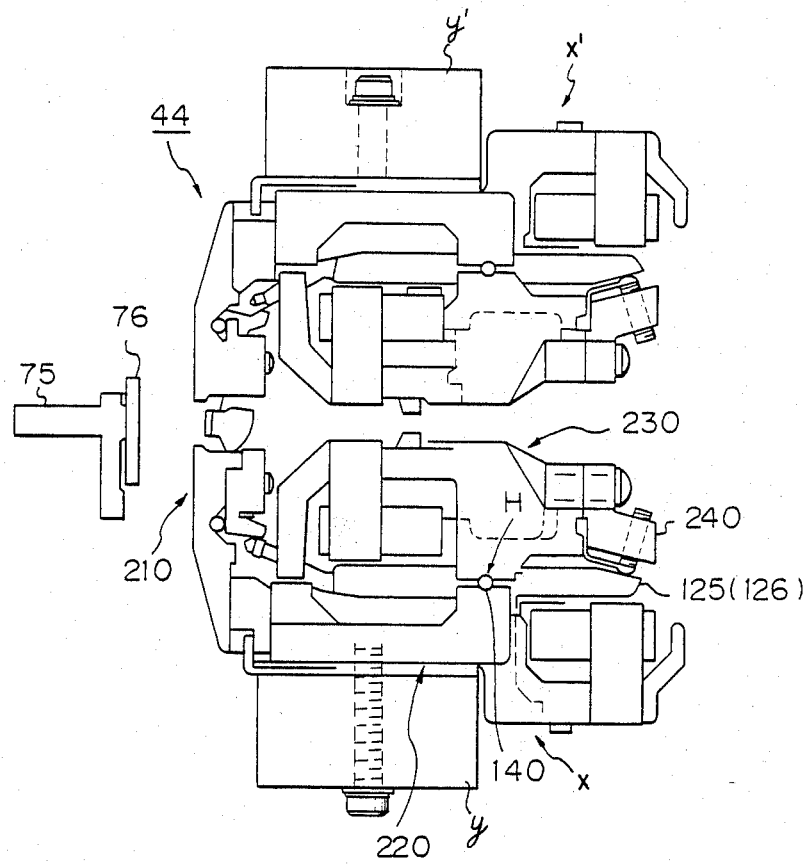

FIGS. 35 through 38 illustrate a hammer and magnet assembly 44, in which pairs of upper and lower magnet modules X and X' and stays Y and Y' are arranged face to face with respect to each other and adjacent the platen 75 and the type belt 76, as seen in FIG. 35.

Figure 36:
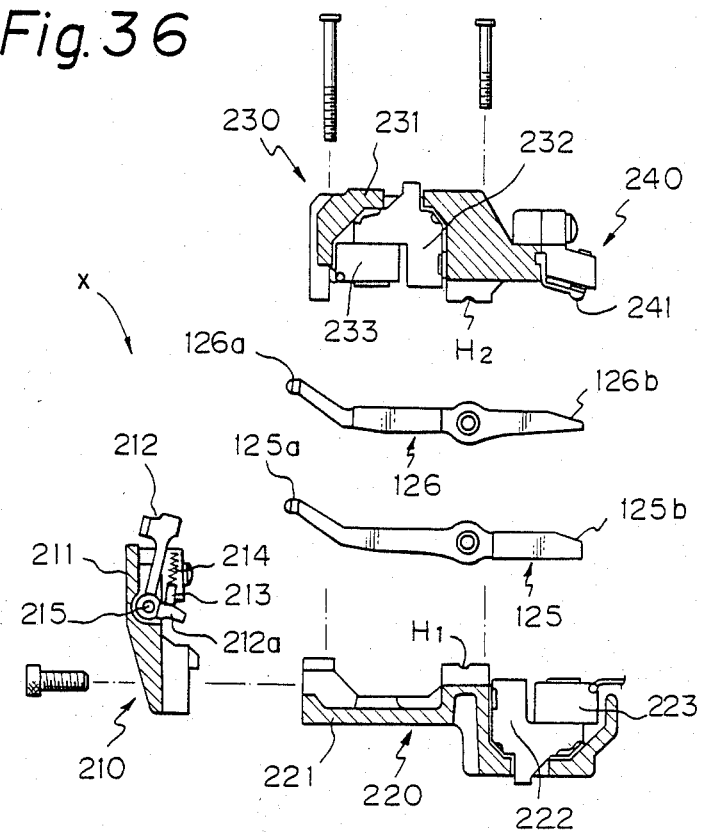

FIG. 36 is an exploded view of a single unit of the magnet module X comprising a first structural unit 210, a second unit 220, a third unit 230, a fourth unit 240, and a pair of armature levers or fingers 125 and 126. The first unit 210 comprises a body 211 on which hammers 212 (only a single hammer is shown) are pivotably mounted about a pin or shaft 215, each hammer being always urged in the clockwise direction by a spring 214 via a plunger 213. The first unit 210 is rigidly connected to the second member 220, which comprises a body 221 on which pairs of magnet cores 222 and magnet coils 223 are provided for exciting each core 222 to attract a rear portion 125b of the armature lever 125, so that a front end thereof 125a comes into contact with a lever portion 212a of the hammer 212 to actuate the latter. The third unit 230 is rigidly connected to the second unit 220, so as to form a shaft supporting hole H (FIG. 35) between semicircular-shaped grooves H1 and H2 of these units 220 and 230, and so that the hole H serves to support a shaft 130 (FIGS. 35 and 37) for the levers 125 and 126. The third unit 230 also comprises a body 231 on which pairs of magnet cores 232 and magnet coils 233 are provided for exciting each core 232 to attract a front portion of the armature lever 126, so that a front end 126a thereof comes into contact with a lever portion 212a of the next hammer 212 to actuate the latter. The fourth unit 240 is rigidly mounted on the third unit 230 and comprises a rubber damping member 241 with which the rear end portion 125b or 126b of the armature lever 125 or 126 comes into contact so as to absorb the hammer impact and prevent the generation of sound.

Figure 37:
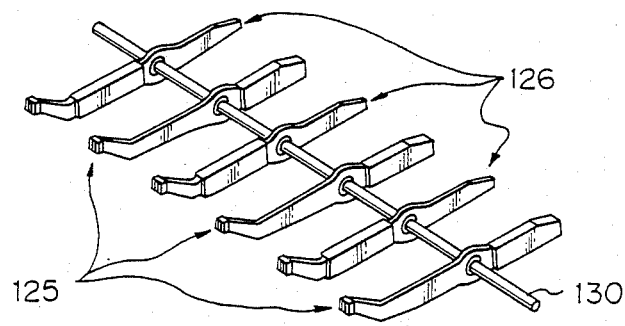

The armature levers 125 and 126 are alternately arranged and each lever is pivotably mounted on said shaft 130, as seen from FIG. 37. These units 210, 220, 230, 240 and levers or fingers 125 and 126 constitute modules, as seen from FIG. 38, in which the respective units are illustrated as separated.

Ink Ribbon Assembly

Figure 41:
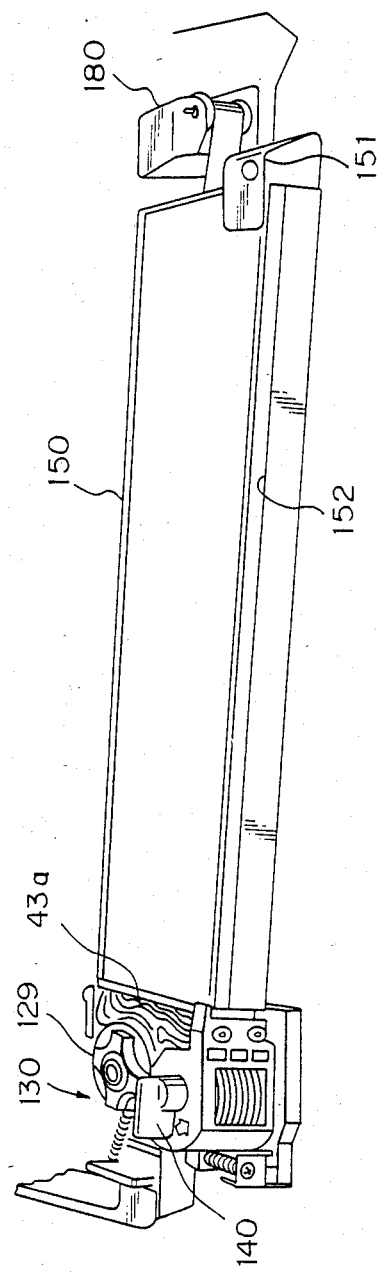

FIGS. 39 through 41 illustrate an ink ribbon assembly 43, in which an ink ribbon cartridge 150 is set in a predetermined position in a ribbon case 152 with the help of a resilient guide member 151 provided on the ribbon case 152 and a pair of round-shaped portions 152a provided on the case for cooperating with the open end edges of the cartridge 150. The resilient member 151 urges the cartridge 150 toward the left (in FIG. 39) when and after the latter is positioned on the case surface. A resilient flap 153 attached to the cartridge 150 and a stopper 154 provided on the ribbon case 152 can also be employed for the same purpose, as illustrated in FIG. 40. In FIGS. 39 and 41, reference numeral 130 denotes a ribbon driving means including a manual operating knob 129 and an idle roller knob 140, which will be described hereinafter in detail. On the other side of the case 152 a ribbon detector 180 is provided, which will also be discussed hereinafter.

It should be noted, however, that an ink ribbon can also be set directly on the ink ribbon case 152 without using a cartridge 150, such as the one mentioned above.

Figure 42:
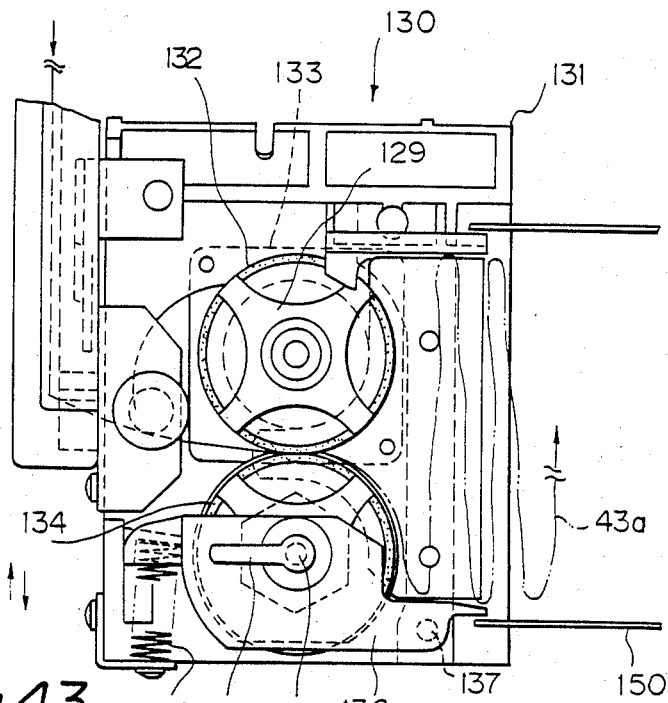
Figure 44:
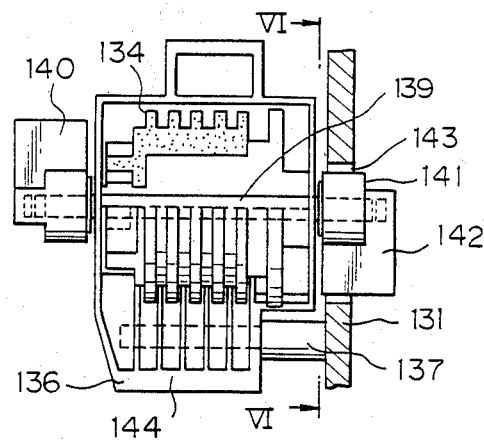

FIG. 42 illustrates a ink ribbon driving means 130 for feeding the ink ribbon 43a in the direction indicated by the arrows into the ribbon cartridge 150 or directly into the ribbon case 152 (FIG. 39) when using no ribbon cartridge. A fixed driving roller 132 is rotatably mounted on a bracket member 131 and directly driven by a motor shaft of the motor 133 provided on the bracket 131 at the other side thereof. An idle or tension roller 134 is rotatably mounted on an arm member 136 which is pivotably connected to the bracket 131 about a point 137. A spring 138 urges the roller 134 against the fixed roller 132 so as to feed the ribbon 43a between the rollers 132 and 134 which are provided with rubber portions on the outer peripheries thereof, as known in the prior art. The idle roller 134 is provided with peripheral grooves or a comb-like outer periphery, as seen in FIG. 44, to feed the ink ribbon 43a with more reliability. The top of the driving roller is mounted a manual operating knob 129 by which the ink ribbon 43a can be manually fed in the same direction, when the ink ribbon is set on or removed from the ribbon case.

Figure 43:
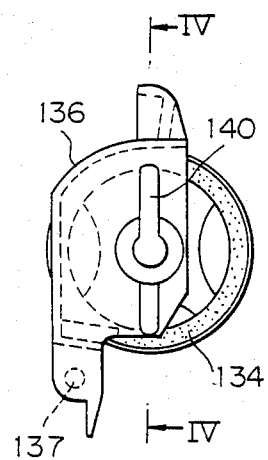
Figure 46:
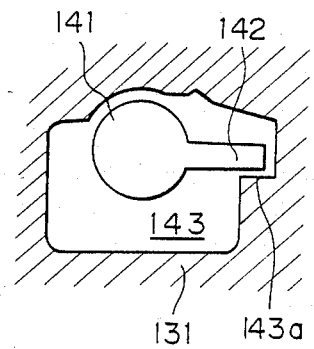
Figure 48:
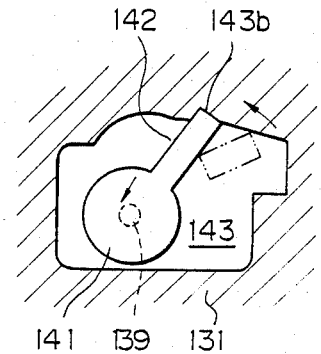

On the other hand, another knob 140 is attached to the top end of a shaft 139 of the idle roller 134, as seen in FIGS. 43 and 44. The other end of the idle roller shaft 139 is attached to a cam member 141 (FIG. 44) having a projected portion 142, as illustrated in FIGS. 46 and 48. The cam member 141 is located in a guide opening 143 provided in the bracket 131 and can be moved within the opening 143 in the range defined by stop portions 143a (FIG. 46) and 143b (FIG. 48) of the opening 143 with which the projection 142 engages alternatively.

Figure 45:
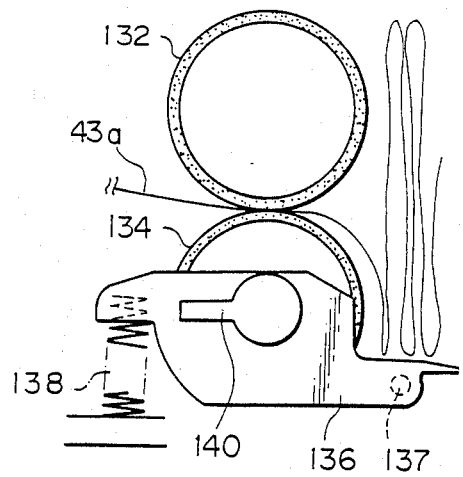
Figure 47:
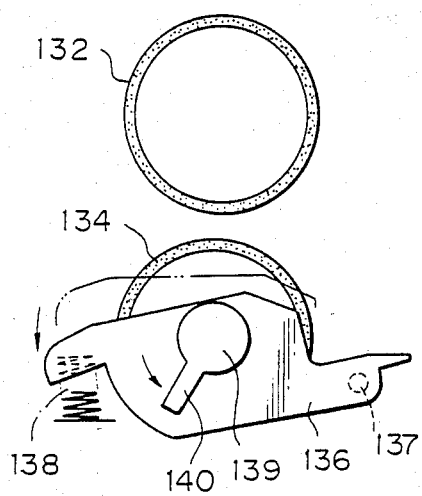

That is, when the knob 140 is in the position shown in FIGS. 42 and 45, the projection 142 of the cam 141 is positioned as shown in FIG. 46, so that the roller 134 is engaged with the driving roller 132 by the spring 138. However, when the ink ribbon 43a is to be replaced, the knob 140 is manually moved in the counterclockwise direction as seen in FIG. 47, and, therefore, the arm 136 is pivoted in the same direction about the point 137 against the spring 138 and the roller 134 is disengaged from the driving roller 132. The projection 142 of the cam 141 is, in this case, engaged with the stop portion 143b, as seen in FIG. 48, to keep the roller 134 in this position away from the roller 132. When the knob 140 is moved in the clockwise direction, the projection 142 can be moved until it is stopped by the stop portion 143a of the opening 143.

In FIG. 44, a comb-like plate member 144 is mounted on the bracket 131 to remove the ink ribbon 43a from the two rollers 132 and 134 just after it passes through the driving spot between the two rollers 132 and 134 so as to guide the ribbon into the ribbon case 152 or cartridge 150 in a zig-zag style.

Figure 49:
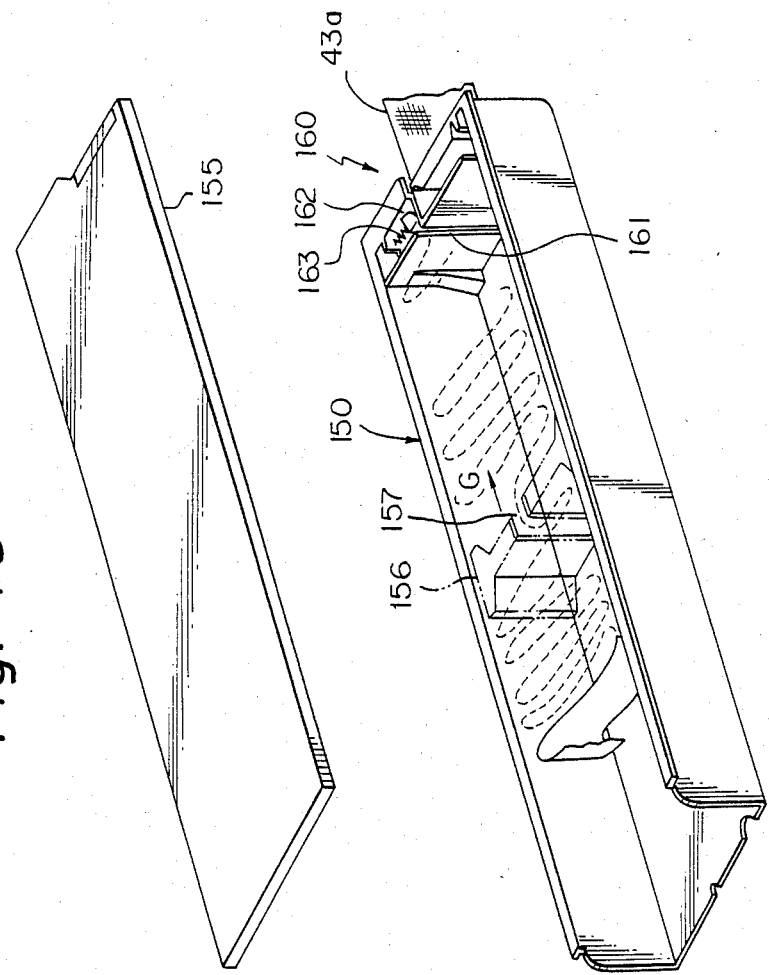
Figure 50:
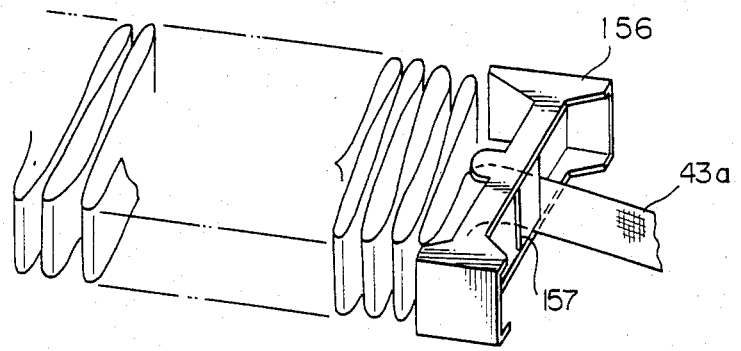
Figure 51:
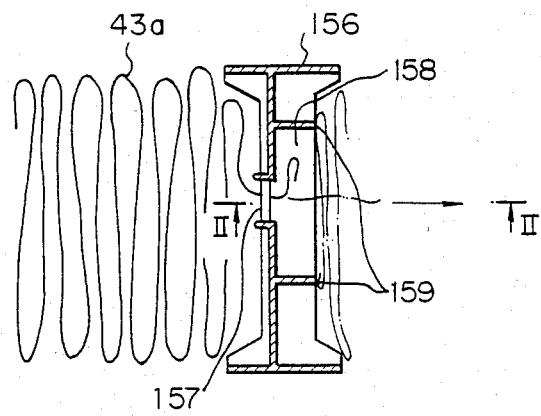
Figure 52:
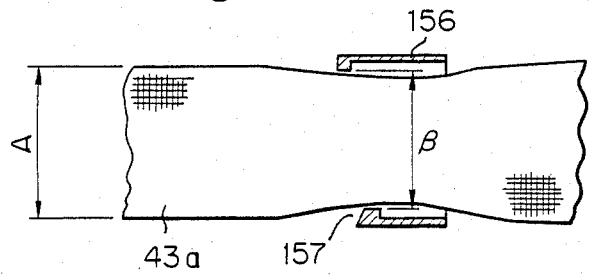

FIG. 49 illustrates a ribbon cartridge 150, in which the ink ribbon 43a is accommodated in zig-zag style and a slide member 156 is arranged so as to automatically slide in the direction indicated by an arrow G in accordance with the amount of the used ink ribbon located at the left hand side thereof. The sliding member 156 has a vertical slot 157, as also shown in FIGS. 50, 51 and 52, through which the ink ribbon 43a passes. The vertical dimension B of the slot 157 is a little smaller than the width A of the ink ribbon 43a, as seen in FIG. 52, so that the ink ribbon 43a is slightly bent with respect to the width thereof when it passes through the slot 157, which forces the ink ribbon into a zig-zag style just after it is discharged from the slot 157. In addition, the sliding member 156 is provided, at the exit of the slot 157, with a pair of projections 159 and a buffering space 158 between the two projections 159, as seen in FIG. 51, so that the ink ribbon 43a discharged from the slot 157 is first stagnant in the buffering space 158 and then comes into contact with the projections 159 which smoothly force the ribbon into a zig-zag style.

In FIG. 49, a braking means 160 is provided in the cartridge 150 at the downstream or discharge end thereof, which means comprises a braking pad 162 made of suitable elastic material being urged by a spring 163 against the opposite wall defining an outlet slit 161. Therefore, while the ink ribbon 43a is being discharged through the outlet slit 161, the ribbon is appropriately subject to a braking force to exert a tension thereto. The assembly of the ribbon cartridge 150 is covered with a cover member 155 and set on the stationary case portion 152, as described hereinbefore.

Figure 53:
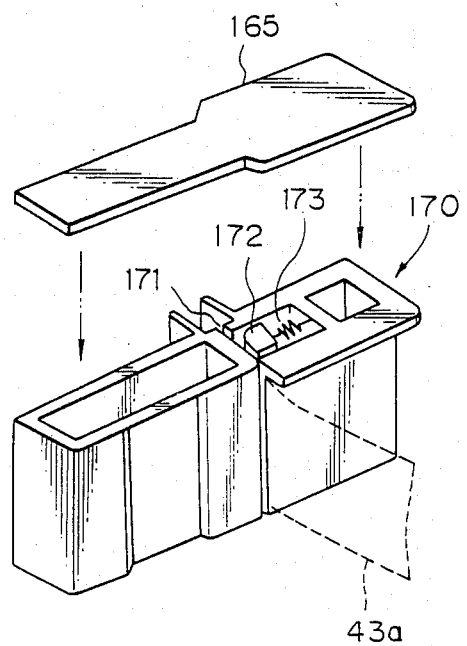

FIG. 53 illustrates a braking means 170 which is independently used without a ribbon cartridge. Therefore, when the ink ribbon 43a is to be set directly on the ribbon case 152 (FIG. 39), the brake member 170 has to be set at the outlet portion of the ribbon case 152. The brake member 170 comprises an outlet slit 171, a brake pad 172, and a spring 173, as well as a brake cover 165, in the same manner as the brake means 160 described above with reference to FIG. 49.

FIGS. 54 and 55 illustrate a ribbon detector 180 which is mounted on the outlet portion of the ink ribbon case 152. The detector 180 comprises a roller 181 and a detecting element 189 for detecting whether the roller 181 rotates with the running ink ribbon (not shown) which passes therethrough. The detector 180 is secured to a mounting member 182 by a screw 186 so that the roller 181 is inclined with respect to the vertical line, as shown in FIG. 55. The mounting member 182 is pivotably mounted on the ribbon case 152 by a screw 183 via a spring member 185 disposed between the ribbon case 152 and the mounting member 182. A signal (not shown) indicating whether the ink ribbon is appropriately running along its passage is provided to the operator, in any of the known methods.

Sheet Feeding

The printing sheet S is fed by the sheet feeder 45, as shown in FIGS. 14 and 26. FIG. 56 is a perspective view of the sheet feeding mechanism 45 which comprises a splined shaft 254 rotatably supported by bearing means mounted on the frames 260 and rotated by a driving motor 84 (FIG. 26) via a belt 84 (not shown in FIG. 56).

On the splined shaft 254 are mounted a pair of tractor means 250 and 251, each including a grip member 152 for engaging with an elongated projection 253 rigidly secured to the frames 260, so as to position the tractor to confine it at a predetermined position. The distance between the two tractor means 250 and 251 is changeable in accordance with the width of the printing sheet. In addition, one or more sheet guide rollers 165 can also be mounted on the splined shaft 254 between the two tractor means.

Figure 57:
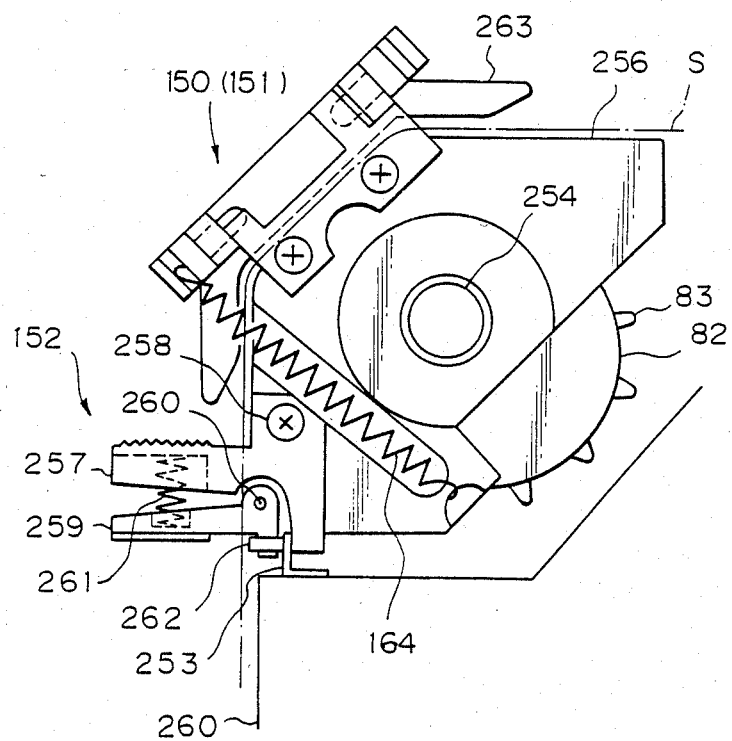

FIG. 57 shows a sheet tractor 150 or 151, in which a feed roller or tractor wheel 82 having a plurality of feed pins 83 on the outer periphery thereof is mounted on the splined shaft 254 so that the tractor 150 can be moved in the axial direction in order to adjust the distance of the two tractors. The printing sheet S, continuously elongated in the longitudinal direction, has tractor pin holes (not shown) at the respective side edges thereof, which engage with the tractor pins 83 of the tractor wheels 82 of the two tractors 150 and 151, respectively, thereby feeding the sheet S in a known manner. The printing sheet S is preferably perforated in the transverse direction by a predetermined interval in the longitudinal direction thereof so that the sheet is easily folded at the sheet stacked sections A1 or B1 (FIG. 1).

A tractor frame 256, upon which the tractor wheel 82 is rotatably mounted and through which the splined shaft 254 passes, is provided with a grip member 152 comprising an fixed arm 257 fixed to the tractor frame 256 by a screw 258 an arm 259 pivotably mounted on the tractor frame 256 about a pin 260; and a spring 261 disposed between the fixed and pivotable arms 257 and 259. These members cooperate to pinch the axially elongated projection 253 fixed to the unit frame 260, so as to locate the tractor 150 (151) fixedly at a desired position along the splined shaft 254. The grip member 152 can be easily manipulated by the operator's hand to adjust the distance between the tractors 150 and 151.

A tractor cover 263 can also be attached to the tractor frame 256 so that it is usually closed by means of a spring 164. When the printing sheet S is to be set on the tractor, the cover 263 is opened outwardly in the axial direction against the spring 164.

According to the tractor as shown in FIG. 57, the pivot center of the tractor frame 256, i.e., the position at which the pair of arms 257 and 259 of the grip member 152 clamp the projection 253, is located in the vicinity of the printing sheet passage. Therefore, unfavorable swinging of the splined shaft 254 or tractor pins 83 can be avoided. A rubber or elastic member 262 can be attached along the axial projection 253 for braking the printing sheet S.

Figure 58:
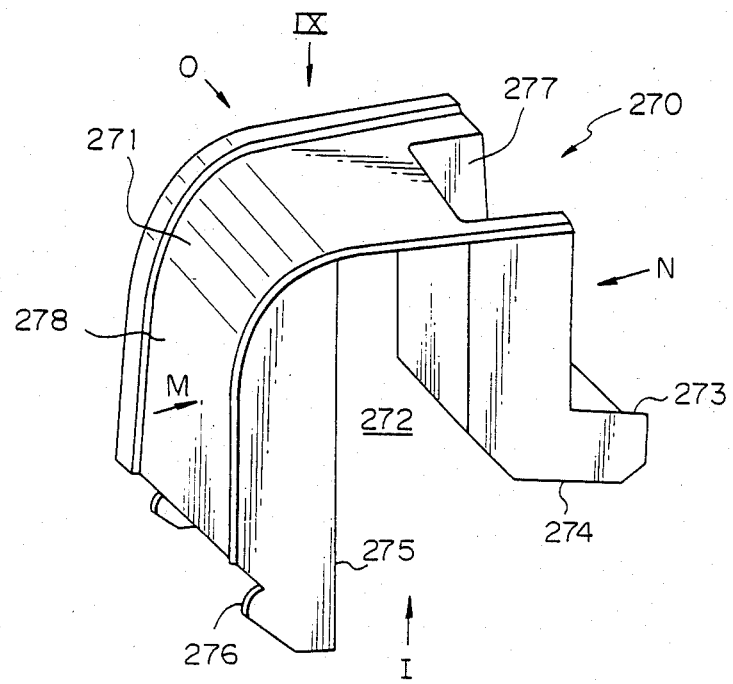
Figure 59:
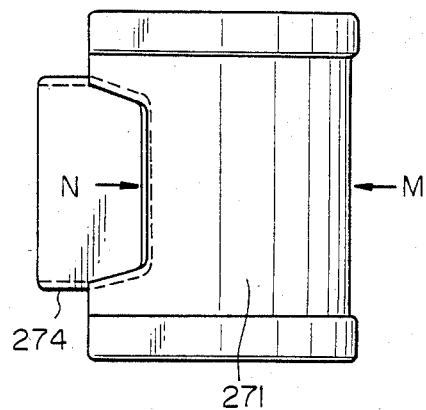
Figure 60:
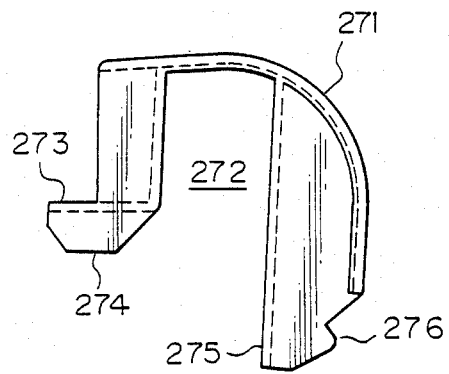
Figure 61:
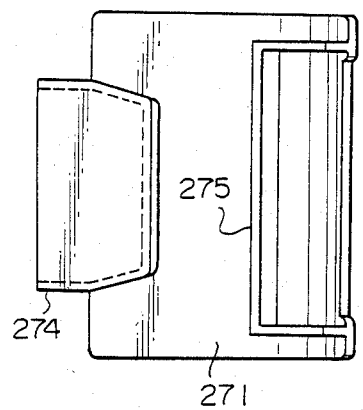
Figure 62:
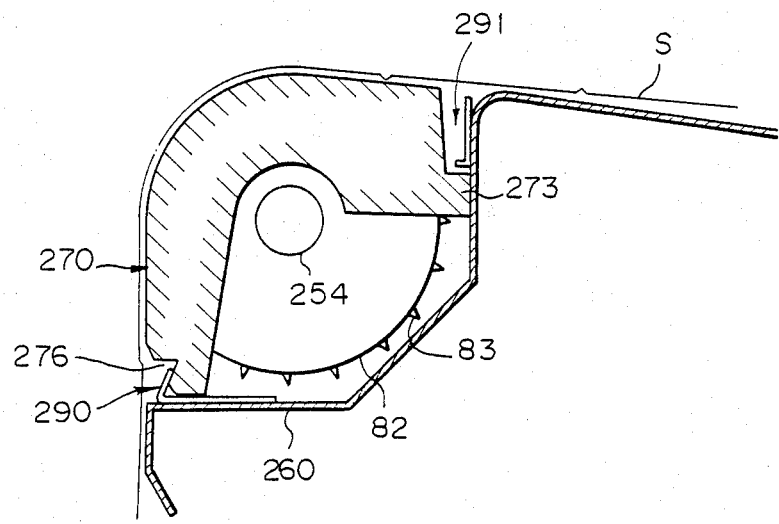
Figure 63:
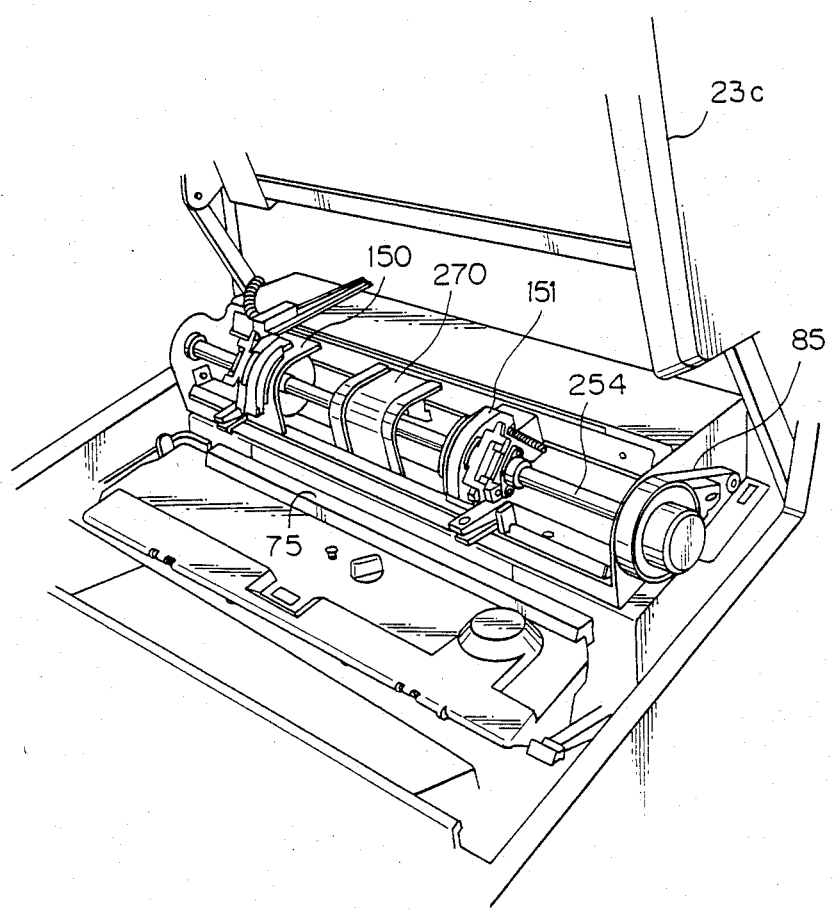

FIGS. 58 through 63 illustrate a sheet guide 270 which can be mounted on the sheet feeder 45, as shown in FIGS. 62 and 63. FIG. 58 is a perspective view of the guide 270; FIG. 59 a view thereof seen from IX in FIG. 58; FIG. 60 a view thereof from O; and FIG. 61 is a view thereof from I. The guide 270 comprises a curved or round portion 271 which has substantially the same radius of curvature as that of the tractor wheel 82 (FIG. 57) and serves as a sheet guide face or passage, when the guide member 270 is mounted on the sheet feeder. Leg portions 274 and 275 extend downwardly from the round portion 271 and define an opening 272 therebetween, through which the splined shaft 254, as mentioned above, passes when the guide 270 is mounted on the feeder. The leg portions 274 and 275 are provided with jaw portions 273 and 276, respectively, in the vicinity of the lower ends thereof. The leg portions 274 and 275 can be resiliently deformed inwardly with respect to each other by applying force to the side surfaces 277 and 278 of the respective leg portions 274 and 275 in the direction indicated by M and N by an operator's hand, so that the jaw portions 273 and 276 resiliently engage with stopper members 291 and 290, respectively, fixed to the unit frame 260, as seen in FIG. 62.

One or more guide members 270 as mentioned above may be mounted on the feeder according to the distance between the two tractors 150 and 151, i.e., the width of the printing sheet S. If the width of the printing sheet is small enough, it is, of course, not necessary to use any guide member 270.

Figure 64:
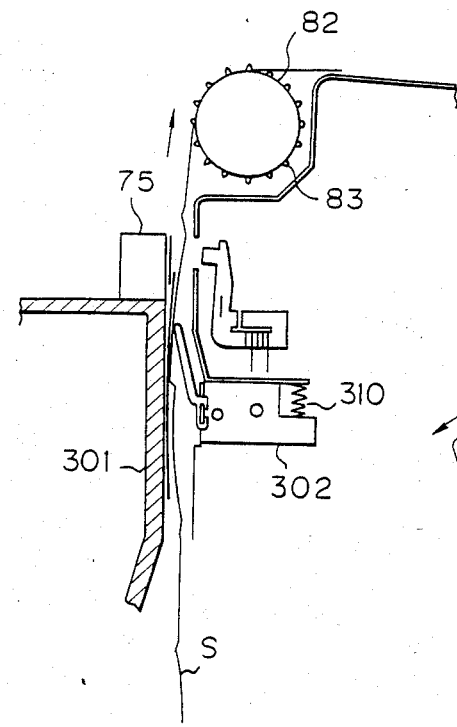
Figure 65:
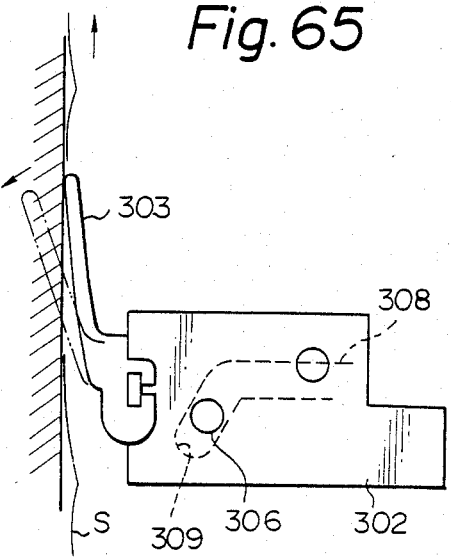
Figure 66:
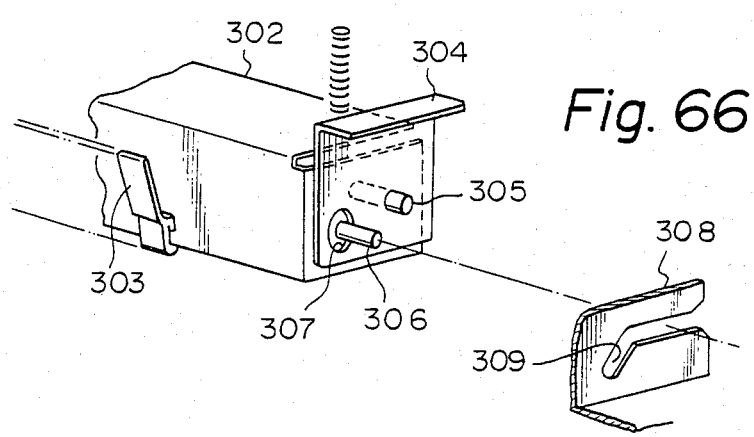

FIGS. 64 through 66 illustrate a sheet braking means, in which the printing sheet S is subjected to a braking force, immediately before it passes through the above-mentioned sheet feeder comprising the tractor wheels 82, by a plurality of rubber flaps or lips 303, which attach at the lower ends thereof to a stay or casing 302 for the above-mentioned printing magnet assembly, for instance. A desirable number of the rubber lips 303 can be arranged transversely at regular intervals, as seen from FIG. 66, with respect to the printing sheet S. Each rubber flap 303 extends upwardly to urge the sheet S against an opposite fixed guide wall 301, since the rubber lip 303 is biased from its unloaded state, as indicated by the dotted line in FIG. 65.

On the other hand, the casing 302 is mounted on a mounting plate 304 by means of a pin 305 protruding from the side face of the casing 302, which is pivotable with respect to the plate 304 within the range delimited by an opening 307 of the plate 304 and another pin 306 also protruding from the side face of the casing 302. The pin 306 extends through the opening 307 to an inclined guide slot 309 provided in a fixed guide member 308. The plate 304 is rigidly secured to the magnet unit 44 (FIG. 14). The guide member 308 is fixed to a stationary frame. Therefore, when the magnet unit 44 is moved by the lever 54 (FIG. 14), the casing 302 is urged in the counterclockwise direction against a spring 310 (FIG. 64) and therefore tiltable to the left-downward direction in FIG. 65 while the pin 306 is slid along the guide slot 309. Therefore, the printing sheet S is subjected to a braking force directed downwardly by the rubber flaps 303, while the sheet S is being fed upwardly by the sheet feeder.

We claim:

1. A casing structure for accommodating electrical and mechanical units including heat and sound sources, comprising:
    (a) a first, a second and a third compartment, each having respective air inlets and outlets, said first compartment being connected to said second compartment, which is connected in turn to said third compartment, through respective connecting passages including their air outlets and inlets to constitute an air flow passage through the first, second and third compartments arranged in series;
(b) a heat source and a sound source arranged in said intermediate, second compartment;
(c) a fourth compartment positioned in the connecting passage between said first and second compartments;
(d) an air cooling fan disposed in said fourth compartment so as to be in the vicinity of said heat source in said second compartment,
wherein cooling air is circulated through said air flow passage from said first compartment via said second compartment toward said third compartment and said heat source is compulsorily cooled by said cooling fan;
(e) a first casing unit for containing said first and second compartments; and
(f) a second casing unit for containing said third and fourth compartments,
wherein said second casing unit is connected to said first casing unit so as to be able to open and close with respect to said first casing unit.

2. A casing structure as set forth in claim 1, wherein said first casing unit comprises a bottom portion which horizontally extends from the first casing unit, said extended bottom portion having an upper horizontal metal surface on which said second casing unit is slidingly mounted to be opened and closed so that a metal bottom wall thereof contacts with the upper surface of the extended bottom portion of the first casing unit forming an electrical ground base.

3. A casing structure as set forth in claim 2, wherein said first and second casing units further comprise first and second magnet packing elements positioned on the abutting surface between said first and second casing units, said first and second packing elements define two rows of soundproofing seals when the second casing unit is closed with respect to the first casing unit.

4. A casing structure as set forth in claim 1, wherein said second casing unit is connected to said first casing unit by hinge means.

5. A casing structure as set forth in claim 1, wherein said heat source and sound source comprise a printing unit including a type belt driving device having a type belt connected between a driving pulley and an idle pulley, a printing sheet feeding device for feeding the printing sheet along the type belt, an ink ribbon assembly for bringing ink ribbon in front of the type belt, and a hammer-magnet assembly including hammers for hitting the type belt and magnets for actuating the hammers.

* * * * *